US008197721B2

(12) United States Patent
Stuart et al.

(10) Patent No.: US 8,197,721 B2
(45) Date of Patent: Jun. 12, 2012

(54) THERMOCHROMIC COATINGS II

(75) Inventors: Christopher Stuart, London (GB); Ivan Paul Parkin, Pennyland (GB)

(73) Assignee: UCL Business PLC (GB)

( * ) Notice: Subject to any disclaimer, the term of this patent is extended or adjusted under 35 U.S.C. 154(b) by 604 days.

(21) Appl. No.: 12/374,642

(22) Filed: Jan. 21, 2009

(65) Prior Publication Data
US 2010/0270519 A1    Oct. 28, 2010

(51) Int. Cl.
*H01B 1/02* (2006.01)
*G02F 1/01* (2006.01)
*B05D 5/12* (2006.01)
*C23C 16/00* (2006.01)

(52) U.S. Cl. .................. 252/520.4; 359/288; 427/126.3; 427/255.31; 427/255.32

(58) Field of Classification Search .................. 252/586, 252/520.4; 427/255.31, 255.32; 359/288
See application file for complete search history.

(56) References Cited

U.S. PATENT DOCUMENTS

| 4,138,512 A | 2/1979 | Glaski |
| 4,401,690 A | 8/1983 | Greenberg |
| 4,992,305 A * | 2/1991 | Erbil ............................. 427/252 |

FOREIGN PATENT DOCUMENTS

| GB | 2114965 | 9/1983 |
| WO | WO2005059201 | 6/2005 |
| WO | WO 2005059201 A1 * | 6/2005 |

OTHER PUBLICATIONS

T. Maruyama, et al., "Vanadium Dioxide Thin Films Prepared by Chemical Vapour Deposition From Vandium (III) Acetylacetonate" Journal of Material Science, (1993) 28, 5073-5078; Japan.
T.J. Hanlon, et al., "Molybdenum-doped Vanadium Dioxide Coatings on Glass Produced by the Aqueous Sol-Gel Method" Thin Solid Films, (2003) 436, 269-272; United Kingdom.
P. Jin, et al., "Relationship Between Transition Temperature and x in V1-x W xO2 Films Deposited by Dual-Target Magnetron Sputtering" Japanese Journal of Applied Physics, Part 1. (1995) 34, 2459-2460; Japan.

(Continued)

*Primary Examiner* — Mark Kopec
*Assistant Examiner* — Jaison Thomas
(74) *Attorney, Agent, or Firm* — Booth Albanesi Schroeder LLP; Todd E. Albanesi

(57) ABSTRACT

The invention provides improved conditions for atmospheric pressure chemical vapor deposition (APCVD) of vanadium (IV) oxide. Specifically, higher quality vanadium oxide (particularly in the form of films) can be obtained by employing concentrations of precursors in the APCVD reaction which are substantially less than those used previously. These conditions improve the reproducibility of the films obtained by APCVD and also prevent particulate formation in the manufacturing apparatus, which in previous work had caused blockages. The films obtained have improved visual appearance, especially color, and/or have improved adhesion to a substrate. The obtained films also show a greater difference in transmission above and below the switching temperature than previous films. The invention also provides doped vanadium oxide, particularly with tungsten. Substrates (e.g. glass substrates) coated with a film of vanadium oxide are also provided. The vanadium oxide of the invention is useful for intelligent window systems, infrared modulators and data storage devices.

21 Claims, 16 Drawing Sheets

OTHER PUBLICATIONS

T.P. Melia, et al., "Vapour Pressures of the Tris(Acetylace-Tonato) Complexes of Scandium(III), Vanadium(III) and Chromium(III)" J. Inorg. Nucl. Chem. (1970) 32, 1489-1493; Great Britain.

K.D. Rogers, "X-Ray Diffraction Study of SimiConductor and Metallic Vanadium Dioxide" Powder Diffraction (1993) 8, 240; United Kingdom.

F.J. Morin, "Oxides Which Show a Metal-to-Insulator Transition at the Neel Temperature" Physical Review Letters (1959) 3, 34; New Jersey, US.

H.W. Verleur, et al., "Optical Properties of VO2 Between 0.25 and 5 eV" Physical Review (1968) 172, 788; New Jersey, US.

A.W. Smith, "Optical Storage in VO2 Films" Applied Physics Letters (1973) 23, 437; New York, US.

W.R. Roach, "Holographic Storage in VO2" Applied Physics Letters (1971) 19, 453; New Jersey, US.

M.A. Richardson, "Infrared Optical Modulators for Missile Testing" Optics & Laser Technology (1998) 30, 137; United Kingdom.

C.G. Granqvist, "Window Coatings for the Future" Thin Solid Films (1990) 193/194, 730; Sweden.

C.G. Granqvist, "Solar Energy Materials" Advanced Materials (2003) 15, 1789; Germany.

C.B. Greenburg, "Undoped and Doped VO2 Films Grown From VO(OC3H7)3" Thin Solid Films (1983) 110, 73-82; The Netherlands.

F. Beteille, et al., "Optical Switching in VO2 Thin Films" J. Sol-Gel Sci. Technol. (1998) 13, 915; Paris, France.

W. Burkhardt, et al., "W- and F-Doped VO2 Films Studied by Photoelectron Spectrometry" Thin Solid Films (1999) 345, 229; Germany.

M.A. Sobhan, "Thermochromism of Sputter Deposited WxV1-xO2 Films" Solar Energy Mater. Solar Cells. (1996) 44, 451; Sweden.

T.D. Manning, "Intelligent Window Coatings: Atmospheric Pressure Chemical Vapour Deposition of Vanadium Oxides" J. Mater. Chem. (2002) 12, 2936; London, UK.

U. Quershi, et al., "Atmospheric Pressure Chemical Vapour Deposition of VO2 and VO2/TiO2 Films From the Reaction of VOC14 and Water" J. Mater. Chem. (2004) 14, 1190; London, UK.

T.D. Manning, et. al., "Atmospheric Pressure Chemical Vapour Deposition of Tungsten Doped Vanadium(IV) Oxide From VOC13, Water and WC16" J. Mater. Chem. (2004) 14, 2554; London, UK.

T.D. Manning, et. al., "Intelligent Window Coatings: Atmospheric Pressure Chemical Vapour Deposition of Tungstun-Doped Vanadium Dioxide" Chem. Mater. (2004) 16, 744; UK.

* cited by examiner

THERMOCHROMIC COATINGS II

CROSS-REFERENCE TO RELATED APPLICATIONS

This application claims priority of Great Britain patent application No. 0614545.2, filed Jul. 21, 2006.

STATEMENT REGARDING FEDERALLY SPONSORED RESEARCH OR DEVELOPMENT

Not applicable

REFERENCE TO MICROFICHE APPENDIX

Not applicable

All documents cited herein are incorporated by reference in their entirety.

TECHNICAL FIELD

This invention relates to improved atmospheric pressure chemical vapour deposition (APCVD) for producing films of thermochromic vanadium (IV) oxide, in particular thermochromic transition metal-doped vanadium (IV) oxide. The invention also relates to improved methods for the production of coatings of thermochromic vanadium (IV) oxide and coated substrates themselves, e.g. glass substrates comprising a coating of thermochromic transition metal-doped vanadium (IV) oxide.

BACKGROUND OF THE INVENTION

Vanadium (IV) oxide ($VO_2$) is a technologically important material based upon its ability to undergo a fully reversible metal-to-semiconductor phase transition. The conversion of the low temperature monoclinic phase $VO_2(M)$ to the high temperature rutile phase [1] $VO_2(R)$ is associated with significant changes in electrical conductivity [2] and optical properties [3] in the near-IR region. $VO_2(R)$ is a semi-metal, reflecting a wide range of solar wavelengths. $VO_2(M)$ is a semiconductor and reflects considerably less energy. $VO_2$ having such a reversible metal-to-semiconductor phase transition is said to be thermochromic.

These properties have led to suggestions of using $VO_2$ in data storage [4 & 5], infrared modulators [6] and intelligent window coatings, i.e. windows which respond to an environmental stimulus [7 & 8]. An intelligent window coating operates by a thin film of thermochromic material on an exterior window modifying the window's reflectance properties as a function of the outside ambient temperature [9]. The solar radiation that is not able to pass through the window when it is in its darkened state must be either reflected or absorbed. Ideally, in a cooling dominated application, the window would pass all or part of the visible radiation incident on the window and reflect the majority of the Sun's near infrared radiation. Incident solar radiation, that is not transmitted, is absorbed. Absorption will cause significant heating of the window if left to stagnate in a coloured state under conditions of high irradiance. Temperature rises in the window will give rise to a radiant heat source adjacent to the room, potentially leading to thermal discomfort, and will impose additional demands on the temperature stability of the materials used in the smart window. Effective thermochromic window coatings would respond to this heating by increasing their reflectance and compensating for the increased heating by reflecting more heat away. Such intelligent coatings could be used in applications such as car windscreens, sunscreens and greenhouses. Such coatings have the potential to provide savings in energy costs (e.g. power to air conditioning units), improved building environments, and environmental benefits (e.g. reduced $CO_2$ emissions).

However, in order for $VO_2$ coatings to be practically useful in these applications, the phase transition temperature between the monoclinic phase and the rutile phase (also referred to as the thermochromic switching temperature) must be lowered. For example, for intelligent window coatings the thermochromic switching temperature should be just above room temperature, e.g. about 25-30° C., although ambient climatic conditions will affect the precise choice. Other applications, such as for night vision apparatus, require $VO_2$ having a thermochromic switching temperature below room temperature, i.e. below 25° C.

Unfortunately, the thermochromic switching temperature of $VO_2$ itself is 68° C., meaning that unmodified $VO_2$ is not ideal for the above mentioned applications. Researchers have therefore developed techniques for reducing the thermochromic switching temperature of $VO_2$, the most efficient of which has been doping tungsten ions into the $VO_2$ lattice using sol-gel [9 & 10] and physical vapour deposition methods [11 & 12]. However, these known techniques are slow, are not compatible with large area glass manufacture and are unsuitable for incorporating into conventional float glass production lines as they require off production line manufacture, such as cutting the glass before deposition.

Reference 13 discloses the use of APCVD for producing films of thermochromic transition metal-doped vanadium (IV) oxide. Films of tungsten-doped vanadium (IV) oxide were obtained with tungsten doping up to 3.1% and with transition temperatures down to 5° C. However, the films obtained in reference 13 were yellow-brown in colour, which is not an ideal colour for use in intelligent window coatings.

An object of the invention is therefore to provide films of thermochromic vanadium (IV) oxide, in particular thermochromic transition metal-doped vanadium (IV) oxide, having improved colouring, particularly for use in intelligent window coatings (e.g. coatings for architectural glass), while maintaining the thermochromic properties of the films. A further object of the invention is to provide methods for production of the films of the invention having improved reproducibility compared to those known in the art.

DISCLOSURE OF THE INVENTION

Atmospheric pressure chemical vapour deposition (APCVD) of vanadium (IV) oxide is typically carried out by mixing an oxygen precursor and a vanadium precursor (and optionally a transition metal dopant precursor) in an APCVD reactor. The precursors are fed to the APCVD reactor via reactant lines and carried by flows of inert gas, usually nitrogen. An example of such an apparatus, having a plain line carrying the oxygen precursor (e.g. water), a first bubbler line carrying the vanadium precursor and a second bubbler line carrying the transition metal dopant precursor, is described in reference 16 and is particularly shown in FIG. 1 of reference 16.

The inventors have discovered that higher quality vanadium (IV) oxide (particularly in the form of films) can be obtained by employing concentrations of precursors (especially the vanadium precursor) in the APCVD reaction which are substantially less than the concentrations of precursors used in the prior art. These conditions improve the reproducibility of the films obtained by APCVD and also prevent particulate formation in the manufacturing apparatus, which in previous work had caused blockages. The films obtained have improved visual appearance, especially colour, and/or have improved adhesion to a substrate. The obtained films also show a greater difference in transmission above and below the switching temperature than previous films.

Furthermore, when the vanadium (IV) oxide is doped (e.g. with tungsten), the methods of the invention allow an atom % transition metal dopant of up to about 8.2%, which is higher than doping levels achieved with prior art methods. The invention therefore provides thermochromic transition-metal doped vanadium (IV) oxide having a switching temperature as low as about −28° C.

Accordingly, in a first aspect of the invention there is provided a method of producing thermochromic vanadium (IV) oxide by atmospheric pressure chemical vapour deposition (APCVD) comprising the steps of:

(i) mixing together (a) a vanadium precursor, (b) an oxygen precursor, and, optionally, (c) a transition metal dopant precursor in the presence of an inert gas to form a precursor mixture;

(ii) reacting together the precursors of the precursor mixture in an atmospheric pressure chemical vapour deposition reactor; and (iii) depositing the thermochromic vanadium (IV) oxide, characterised in that the vanadium concentration in the precursor mixture is, before reaction, less than $1 \times 10^{-3}$ mol/$dm^3$.

The invention particularly provides films of vanadium (IV) oxide. Accordingly, in a second aspect of the invention there is provided a method of producing a film of thermochromic vanadium (IV) oxide on a substrate by atmospheric pressure chemical vapour deposition (APCVD) comprising the steps of:

(i) mixing together (a) a vanadium precursor, (b) an oxygen precursor, and, optionally, (c) a transition metal dopant precursor in the presence of an inert gas to form a precursor mixture;

(ii) reacting together the precursors of the precursor mixture in an atmospheric pressure chemical vapour deposition reactor; and (iii) depositing the thermochromic vanadium (IV) oxide onto the substrate, characterised in that the vanadium concentration in the precursor mixture is, before reaction, less than $1 \times 10^{-3}$ mol/$dm^3$.

In a third aspect of the invention, there is provided the use of a vanadium precursor carried in an inert gas in the atmospheric pressure chemical vapour deposition (APCVD) of vanadium (IV) oxide, wherein the vanadium concentration is less than $1 \times 10^{-3}$ mol/$dm^3$. As described above, the APCVD employs an oxygen precursor and, optionally, a tungsten precursor.

The invention employs concentrations of precursors in the APCVD reaction which are substantially less than the concentrations of precursors used in the prior art. The concentrations used herein are expressed as the number of mols per $dm^3$ of the inert gas. The vanadium concentration in the precursor mixture is, before reaction, less than $1 \times 10^{-3}$ mol/$dm^3$ (preferably less than $5 \times 10^{-4}$ mol/$dm^3$), preferably from about $1 \times 10^{-7}$ mol/$dm^3$ to $1 \times 10^{-3}$ mol/$dm^3$, preferably from about $1 \times 10^{-6}$ mol/$dm^3$ to $1 \times 10^{-4}$ mol/$dm^3$, preferably from about $1 \times 10^{-5}$ mol/$dm^3$ to $1 \times 10^{-4}$ mol/$dm^3$, preferably about $4 \times 10^{-5}$ mol/$dm^3$. Preferably, the oxygen concentration in the precursor mixture is, before reaction, less than $1 \times 10^{-2}$ mol/$dm^3$ (preferably less than $5 \times 10^{-3}$ mol/$dm^3$), preferably from about $1 \times 10^{-6}$ mol/$dm^3$ to $1 \times 10^{-2}$ mol/$dm^3$, preferably from about $1 \times 10^{-5}$ mol/$dm^3$ to $1 \times 10^{-3}$ mol/$dm^3$, preferably about $2 \times 10^{-4}$ mol/$dm^3$.

Preferably, the vanadium (IV) oxide obtained by the invention is transition-metal doped (preferably with tungsten). In this embodiment, step (i) of the method of the invention comprises mixing together (c) a transition metal dopant precursor. Preferably, the transition-metal concentration in the precursor mixture is, before reaction, less than $1 \times 10^{-3}$ mol/$dm^3$ (preferably less than $5 \times 10^{-4}$ mol/$dm^3$), preferably from about $1 \times 10^{-7}$ mol/$dm^3$ to $1 \times 10^{-3}$ mol/$dm^3$, preferably from about $1 \times 10^{-7}$ mol/$dm^3$ to $1 \times 10^{-4}$ mol/$dm^3$, preferably from about $1 \times 10^{-7}$ mol/$dm^3$ to $1 \times 10^{-5}$ mol/$dm^3$, preferably from about $5 \times 10^{-7}$ mol/$dm^3$ to $5 \times 10^{-6}$ mol/$dm^3$, preferably about $1 \times 10^{-6}$ mol/$dm^3$.

Preferably, the molar ratio of vanadium to oxygen in the precursor mixture is, before reaction, at most 1:1, preferably from 1:1 to 1:60, preferably from 1:1 to 1:20, preferably from 1:1 to 1:10, more preferably from 1:2 to 1:5, more preferably about 1:3.

It has also been discovered that a wide range of transition metal doping is tolerated by the vanadium (IV) oxide. This is surprising since it could not have been predicted that the tungsten precursor would not have had an effect on the phase of the doped vanadium (IV) oxide which is obtained in reaction. However, the quality of the film obtained can be optimized by modulating the introduction of the transition metal dopant precursor into the precursor mixture. Preferably, the molar ratio of vanadium to transition metal in the precursor mixture is, before reaction, at most 1:1, preferably from 1:2 to 1:400, preferably from 1:2 to 1:200 (preferably about 1:100).

Substrates having a film of thermochromic vanadium (IV) oxide coated thereon obtainable by the method of the invention are also provided. In another aspect of the invention, thermochromic vanadium (IV) oxide obtainable by the method of the invention is provided. Films of thermochromic vanadium (IV) oxide obtainable by the method of the invention are also provided.

As discussed above, the vanadium (IV) oxide and films of the invention are of higher quality than obtainable previously. In particular, the tungsten-doped vanadium (IV) oxide of the invention is silver-blue in colour, which is more suitable for use in intelligent window coatings than the yellow-brown tungsten of the prior art. Accordingly, in a further aspect of the invention there is provided silver-blue tungsten-doped vanadium (IV) oxide.

The invention also allows higher doping levels of transition metal than previously obtainable. Accordingly, in a further aspect of the invention there is provided a film of thermochromic transition metal-doped vanadium (IV) oxide having an atom % transition metal dopant >5%, preferably >5% and <10%, more preferably from about 6% to about 9%, more preferably about 8%. The invention also provides a film of thermochromic transition metal-doped vanadium (IV) oxide having a thermochromic switching temperature <5° C., preferably <5° C. and >−40° C., more preferably from about −30° C. to about 0° C., more preferably about −28° C.

In another aspect of the invention, there is provided a substrate coated with a film of thermochromic transition metal-doped vanadium (IV) oxide of the invention.

Products comprising a substrate of the invention, such as data storage devices infrared modulators and intelligent windows, i.e. windows which respond to an environmental stimulus such as heat [14 & 15], are also provided.

APCVD

APCVD is a well known technique for producing inter alia doped silicon dioxide and has also been used successfully to produce a single phase of $VO_2$ from $[VCl_4]$ and water [16], and doped $VO_2$ [13].

Known APCVD apparatuses include the SierraTherm™ 5500 Series Atmospheric Pressure CVD Systems. A preferred APCVD apparatus is described in reference [16].

The precursors are mixed together in the presence of an inert gas (e.g. argon or nitrogen), preferably nitrogen, preferably at least 99% nitrogen, preferably at least 99.9% nitrogen, more preferably at least 99.99% nitrogen. Although absolutely pure nitrogen is not required for the invention, the precursors are generally sensitive to oxygen contamination and particular effort should be made to minimise oxygen in the inert gas. Typically, the precursors are mixed from feeds of inert gas carrying the precursors, for example as described in reference 16. The precursors may be mixed together in the APCVD reactor itself, or in a mixing chamber upstream of the reactor.

Transition Metal-Doped Vanadium (IV) Oxide

The transition metal dopant maybe any transition metal which is not vanadium having an oxidation state of at least 4. Preferred transition metals are those in group 4 (e.g. titanium), group 5 (e.g. tantalum and niobium, especially niobium) and group 6 (e.g. molybdenum and tungsten, especially tungsten). Group 5 and 6 transition metals are more preferred, with tungsten being particularly preferred. The transition metal dopant forms a solid solution with the vanadium (IV) oxide which is thermochromic.

As an alternative to the transition metals, other metals useful in the present invention are the lanthanides.

In further embodiments, non-transition metal dopants, such as lead and tin, may also be useful in the invention in place of the transition metal dopants.

It is believed that the transition metal-doped vanadium (IV) oxide of the invention is a solid solution of the formula $V_{1-x}T_xO_2$, where T is a transition metal dopant and $0<x<1$. As used herein, the atom % transition metal dopant is equal to the percentage of transition metal dopant and vanadium atoms which are transition metal dopant atoms $(100(x/[\{1-x\}+\{x\}])$, i.e. 100x).

The transition metal-doped vanadium (IV) oxide of the invention is doped such that $x>0$.

Although the invention may provide transition metal-doped vanadium (IV) oxide doped wherein x is up to 0.08, x is preferably less than or equal to x1, where x1 is 0.05 or less, e.g. 0.045, 0.04, 0.035, 0.030, 0.025, 0.025, 0.023, 0.022, 0.021, 0.020 or 0.019. It is especially preferred that x1 is 0.03 (i.e. 3 transition metal dopant atom %).

Preferably, x is more than or equal to x2, where x2 is 0.005 or more, e.g. 0.01, 0.012, 0.013, 0.014, 0.015 or 0.016. It is also preferred in some embodiments that x2 is 0.02.

These ranges of x are especially preferred for applications requiring a thermochromic switching temperature around room temperature. In one embodiment of the present invention, it is preferred that the thermochromic switching temperature is from about 15° C. to about 40° C., more preferably from about 20° C. to about 35° C., more preferably from about 25° C. to about 30° C., e.g. from 25° C. to 30° C. In another embodiment of the present invention, it is preferred that the thermochromic switching temperature is below about 25° C. (e.g. below 25° C.), but preferably also above or equal to about 5° C.

It has been discovered by the inventors that incorporation of tungsten caused a reduction in the $VO_2$ thermochromic switching temperature of about 19° C. per tungsten atom % (at least up to about 3% tungsten). In one embodiment, it is preferred that $x4 \leq x \leq x3$ where x3 is 0.023 or less, e.g. 0.022, 0.021, 0.020 or 0.019, and x4 is 0.012 or more, e.g. 0.013, 0.014, 0.015 or 0.016. A preferred range of x in this embodiment is $0.012 \leq x \leq 0.023$, more preferably $0.013 \leq x \leq 0.022$, more preferably $0.014 \leq x \leq 0.021$, more preferably $0.015 \leq x \leq 0.020$, still more preferably $0.016 \leq x \leq 0.019$.

A particularly preferred tungsten-doped vanadium (IV) oxide has a thermochromic switching temperature of 29° C. obtained with 1.9 atom % tungsten (i.e. x=0.019).

In another embodiment, it is preferred that x is more than or equal to 0.016. Preferably x is also less than or equal to 0.031, more preferably less than or equal to 0.030.

In some embodiments, the transition metal-doped vanadium (IV) oxide of the invention contains no chlorine at a 0.5 atom % detection limit.

In some embodiments, the transition metal-doped vanadium (IV) oxide of the invention shows peaks for oxygen, vanadium, tungsten, silicon, carbon and nitrogen in X-ray Photoelectron Spectroscopy (XPS) analysis. If necessary, carbon and nitrogen may be removed from the surface by etching.

Precursors

The vanadium, transition metal dopant and oxygen precursors are reactable in an APCVD reactor to form transition metal-doped vanadium (IV) oxide.

The temperature of the reaction of the precursors in the APCVD reactor and (ii) the molar ratio of vanadium in the vanadium precursor to oxygen in the oxygen precursor are important parameters for ensuring that the precursors react together to form thermochromic transition metal-doped vanadium (IV) oxide.

In particular, the precursors must be reacted together in the APCVD reactor at a temperature of 500° C. or more, preferably from 500° C. to 660° C., still more preferably from 550° C. to 650° C. When the vanadium precursor is $[VCl_4]$, it is particularly preferred that the precursors are reacted together in the APCVD reactor at a temperature of 550° C. or more. When the vanadium precursor is $[VOCl_3]$, it is particularly preferred that the precursors are reacted together in the APCVD reactor at a temperature of 600° C. or more.

In one embodiment, the vanadium and transition metal dopant precursors are $[VCl_4]$ and $[WCl_6]$.

Vanadium Precursor

The vanadium precursor may be any precursor containing vanadium capable of reacting in an APCVD reactor with the transition metal dopant and oxygen precursors and providing vanadium to form transition metal-doped vanadium (IV) oxide.

Preferred vanadium precursors are vanadium complexes having at least one ligand (and preferably all ligands) selected from the group consisting of alkoxide (e.g. $C_{1-4}$alkoxide such as ethoxide), halide (e.g. fluoride, chloride, bromide, iodide, preferably chloride), CO, alkyl (e.g. $Cl_{1-4}$alkyl such as methyl, ethyl etc.), amide (e.g. $R^1CONR^1_2$, where each $R^1$ is independently H or $C_{1-4}$alkyl), aminyl (e.g. $NR^1_2$ where $R^1$ is defined as above) and acac (2,4-pentanedione).

More preferred vanadium precursors comprise ligands, such as Cl, which are easily substituted by the oxygen of the oxygen precursor. Preferred vanadium precursors are therefore $[VCl_4]$ and $[VOCl_3]$, especially $[VCl_4]$.

Other preferred vanadium precursors are $[V(acac)_3]$, $[V(acac)_4]$, $[VO(acac)_2]$, $[V(NMe_2)_4]$, $[V(NEt_2)_4]$ and $[VO(OiPr)_3]$.

Transition Metal Dopant Precursor

The transition metal dopant precursor may be any precursor containing tungsten capable of reacting in an APCVD reactor with the vanadium and oxygen precursors and providing the transition metal to form transition metal-doped vanadium (IV) oxide.

Preferred transition metal dopant precursors are transition metal complexes having at least one ligand (and preferably all ligands) selected from the group consisting of alkoxide (e.g. $C_{1-4}$alkoxide such as ethoxide), halide (e.g. fluoride, chloride, bromide, iodide, preferably chloride), CO, alkyl (e.g. $C_{1-4}$alkyl such as methyl, ethyl etc.), amide (e.g. $R^1CONR^1_2$, where each $R^1$ is independently H or $C_{1-4}$alkyl), aminyl (e.g. $NR^1_2$ where $R^1$ is defined as above) and acac (2,4-pentanedione).

Preferred tungsten precursors are $[W(OEt)_5]$, $[W(OEt)_6]$, $[WCl_6]$, $[W(CO)_6]$, $[WF_6]$, $[W(NMe_2)_6]$ and $[W(NEt_2)_6]$, especially $[W(OEt)_5]$, $[W(OEt)_6]$, $[WF_6]$, $[WF_6]$.

An especially preferred tungsten dopant precursor is $[WCl_6]$. This precursor is particularly preferred because of chemical compatibility with $[VCl_4]$ and $[VOCl_3]$, i.e. chlorine containing and absent fluorine or carbon. $[WCl_6]$ has been shown to be a superior precursor for APCVD allowing higher tungsten doping of the $VO_2$ lattice, thus allowing much lower thermochromic switching temperatures.

The amount of transition metal-doped into the vanadium (IV) oxide may be controlled by varying the molar ratio of transition metal in the transition metal precursor to vanadium in the vanadium precursor in the APCVD reaction, i.e. increasing the amount of transition metal to vanadium in the APCVD reaction increases the transition metal doping. Typical molar ratios of transition metal in the transition metal dopant precursor to vanadium in the vanadium precursor are from about 1:200 to about 1:1, e.g. from about 1:200 to about 1:2, preferably about 1:100.

Oxygen Precursor

The oxygen precursor may be any precursor containing oxygen capable of in an APCVD reactor with the transition metal dopant and vanadium precursors and providing oxygen to form transition metal-doped vanadium (IV) oxide. Preferably, the oxygen precursor contains neither vanadium nor transition metal, i.e. it is neither a vanadium precursor nor a transition metal precursor.

Preferred oxygen precursors are selected from the group consisting of molecular oxygen, ozone, air, alcohols (e.g. $R^2OH$, such as methanol and ethanol), carboxylic acids (e.g. $R^1COOH$, such as ethanoic acid), ethers (e.g. $R^2OR^2$), acid anhydrides (e.g. $R^1$—C(O)—O—C(O)—$R^1$), ketones (e.g. $R^2C(O)R^2$), aldehydes (e.g. $R^1C(O)H$), where each $R^1$ is independently H or $C_{1-6}$alkyl and each $R^2$ is independently $C_{1-6}$alkyl.

One preferred oxygen precursor is $H_2O$.
Another preferred oxygen precursor is ethyl acetate.
The Film The tungsten-doped vanadium (IV) oxide films of the invention generally have a thickness from 25 nm to 5000 nm, preferably from 25 nm to 3000 nm, preferably from 50 nm to 500 nm, more preferably from 100 nm to 400 nm. For intelligent window applications, the films preferably have a thickness from 25 nm to 150 nm, preferably from 40 nm to 100 nm, preferably from 50 nm to 80 nm, more preferably from 60 nm to 70 nm.

Film thickness is manipulated principally through deposition time (i.e. the time of reaction), although the concentration of the precursors also has an impact on film thickness.

The inventors have discovered that increasing film thickness decreases its optical transmission. Furthermore, increasing the film thickness increases the magnitude of the difference in transmission in the near infrared region above and below the thermochromic switching temperature. However, film thickness has little effect on the magnitude of the difference in reflectance above and below the thermochromic switching temperature.

In some embodiments, the films of the invention may have worm-like structures with a width of about 10 nm and a length between 100 and 800 nm. Typically, substantially all these structures are perpendicular to the substrate.

The Substrate

Provided the substrate is capable of having a film of transition metal-doped vanadium (IV) oxide deposited on its surface by APCVD, e.g. it is capable of withstanding the temperature of the APCVD, the substrate is not critical to the invention.

However, preferred substrates are glass substrates, e.g. glass slides, films, panes and windows etc. Particularly preferred glass substrates have about a 50 nm thick $SiO_2$ barrier layer to stop diffusion of ions from the glass into the film of transition metal-doped vanadium (IV) oxide.

Other preferred substrates are silicon, $SiO_2$ or metal (e.g. aluminium or copper) substrates. Such substrates may be in the form of slides, films, panes or windows etc.

Substrates coated with a film of transition metal-doped vanadium (IV) oxide of the invention may be used in data storage, infrared modulators and intelligent window coatings.

The invention therefore provides a data storage device (e.g. a cassette, disk, compact disc (CD), digital versatile disk (DVD) etc.) comprising a data recording medium comprising a coated substrate coated with a film of transition metal-doped vanadium (IV) oxide of the invention.

The invention also provides an intelligent window system, i.e. a window which responds to an environmental stimulus such as heat [17 & 18], e.g. without an external driver, comprising a glass substrate coated with a film of transition metal-doped vanadium (IV) oxide of the invention.

The invention also provides infrared modulators, e.g. a devices for controlling the amount of infrared radiation impinging on a detector such as those mentioned in [6], comprising a substrate coated with a film of transition metal-doped vanadium (IV) oxide of the invention.

General

The term "comprising" encompasses "including" as well as "consisting" e.g. a composition "comprising" X may consist exclusively of X or may include something additional e.g. X+Y. The word "substantially" does not exclude "completely" e.g. a composition which is "substantially free" from Y may be completely free from Y. Where necessary, the word "substantially" may be omitted from the definition of the invention.

The term "about" in relation to a numerical value x means, for example, x±10%.

BRIEF DESCRIPTION OF DRAWINGS

FIG. 3A shows how the peak at 27 °2θ changes during heating and FIG. 3B shows how the peak at 37 °2θ changes during heating.

MODES FOR CARRYING OUT THE INVENTION

Film Preparation

Figure 1A:
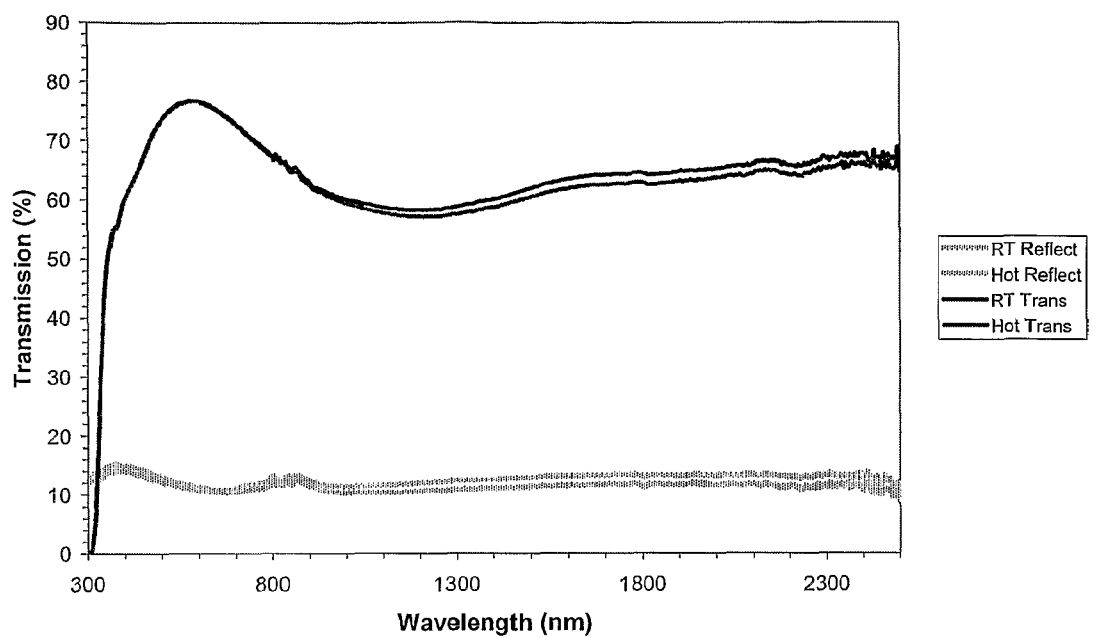
FIGS. 1A-C show the plots of transmission and reflection of incident radiation on films deposited for 15, 30 and 80 seconds, respectively, at both room temperature and at a temperature above the thermochromic switching temperature.

All CVD studies were performed on a custom built apparatus using a previously described procedure [16 & 19]. [VCl$_4$] (99%, Aldrich, UK) and [WCl$_6$] (99.9%, Strem, UK) were placed into separate bubblers. Distilled water was injected into the plain line gas-flow using a variable rate syringe driver and either a 1000 µL 'tuberculin' syringe or a Hamilton 250 µL gas tight syringe-all of the water was effectively flash evaporated as the plain line was heated to 150° C. Nitrogen (99.999%, BOC, UK) was used as the system gas in all CVD reactions. The substrate was float glass that had a 50 nm thick SiO$_2$ barrier layer to stop diffusion of ions from the glass into the film (Pilkington Glass, UK). The glass had dimensions 15 cm×4.5 cm×60.3 cm and was cleaned before use by wiping with a water-soaked tissue, and then a propan-2-ol soaked tissue and then rinsed with propan-2-ol. It was allowed to dry in air prior to mounting in the CVD chamber. A series of films were prepared by using carrier-gas flow-rates of 2.0 L/min through the tungsten precursor bubbler and 0.4 L/min through the vanadium precursor bubbler. The vanadium bubbler was held at a temperature of 50° C. and the tungsten bubbler was varied between 100° C. and 150° C., which are well below the melting point of [WCl$_6$]. The plain line was used at very high flow rates, with experiments carried out between 10 L/min and 20 L/min. The speed of the syringe driver was varied such that the volume of water added was generally between 20 µL and 30 µL, although a number of experiments were carried out at higher and lower water flows.

Film Analysis and Characterization

Analysis of the resulting films consisted of UV/vis, adhesion tests (scratch and abrasion resistance, Scotch tape test), vis/IR reflectance-transmittance, micro Raman spectroscopy, scanning electron microscopy and wavelength dispersive analysis of X-rays (SEM/WDX), glancing angle X-ray diffraction (GAXRD) and X-ray photoelectron spectroscopy (XPS). UV/vis absorption measurements were obtained on a Thermospectronic Helios a spectrometer between 300-1100 nm. Reflectance-transmittance measurements were performed on a Perkin Elmer Lamda 900 or Lamda 950 spectrophotometer between 300 nm and 2500 nm. Transmittance-temperature studies were performed on a Perkin-Elmer 457 grating spectrometer set to 4000 cm$^{-1}$. An aluminium temperature cell controlled by RS cartridge heaters, Eurotherm temperature controllers and k-type thermocouples was used to manipulate sample temperature. Sample temperature was taken from the temperature of the sample holder and therefore does not represent the exact surface temperature of the sample. Raman spectroscopy was performed on a Renishaw in Via spectrometer using a 514.5 nm 6 mW laser at 50× magnification, sample temperature was controlled by a Linkam THMS600 variable temperature cell with a liquid nitrogen pump. SEM images were obtained on a Jeol JSM-6301F scanning electron microscope at 10 kV accelerating voltage. Samples were prepared by deeply scoring the film side of the substrate to cause shelling of the film and hence a distinct edge between the film and substrate. Wavelength dispersive analysis of X-rays (WDX) was performed on a Philips XL30 ESEM instrument using Inca analytical software (Oxford Instruments). X-Ray analysis of the films was determined on a Bruker D8 GADDS diffractometer using Cu K$_\alpha$ radiation at 1.54 Å collimated with either a 15 cm long 0.05 mm collimator (1-2 mm$^2$ illumination area) or 7 cm long 0.1 mm collimator (3-5 mm$^2$ illumination area) with a 5° incident angle. Diffraction patterns at different temperatures were obtained by acquiring discrete data of various temperatures. The temperature was controlled using the aluminium sample holder described above. X-Ray photoelectron spectrometry was performed on a VG ESCALAB 2201 XL instrument using monochromatic Al K$_\alpha$ X-rays with a pass energy of 50 eV. XPS data was analysed using CasaXPS software version 2.0.11.

EXAMPLE 1

Initial experiments were carried out using similar conditions utilized previously for the deposition of tungsten doped VO$_2$ films [20 & 21], however it was found that reaction using [VOCl$_3$] almost invariably produced films of V$_2$O$_5$. This is not surprising given that [VOCl$_3$] contains vanadium(V). Therefore it was determined early on to optimize conditions using [VCl$_4$] as the vanadium precursor. The previous work using [VCl$_4$] as the vanadium source was done with a plain nitrogen flow of approximately 2 L/min. Under these conditions it was found that the results were unpredictable, with films containing variable mixtures of VO$_2$ and V$_2$O$_5$. It was therefore decided to examine the reaction of [VCl$_4$] with H$_2$O at higher N$_2$ plain flow levels of 10 L/min with a view to optimizing the deposition such that it was fully compatible with the use of [WCl$_6$] as the tungsten precursor. This approach instantly brought rewards, not only in terms of reproducibility, but also in terms of the phase deposited (principally VO$_2$) and the visual appearance of the film and adhesion to the substrate. Based on these results subsequent experiments were carried out with plain flows of at least 10 L/min N$_2$.

Previous work using [VCl$_4$] had also suffered from large amounts of particulate formation, which caused frequent blockages. Whilst operating at higher flow rates causes this to be less of a problem it was decided to also reduce the amount of [VCl$_4$] used, to reduce the amount of reactants in the system. Rather than heating the [VCl$_4$] bubbler over 100° C. the bubbler was set to 50° C. with a flow rate of 0.4 L/min N$_2$. The reaction of [VCl$_4$] with H$_2$O was performed with a plain flow of 10 L/min, a mixing chamber temperature of 150° C. and a reactor temperature of 550° C.

EXAMPLE 2

Figure 1B:
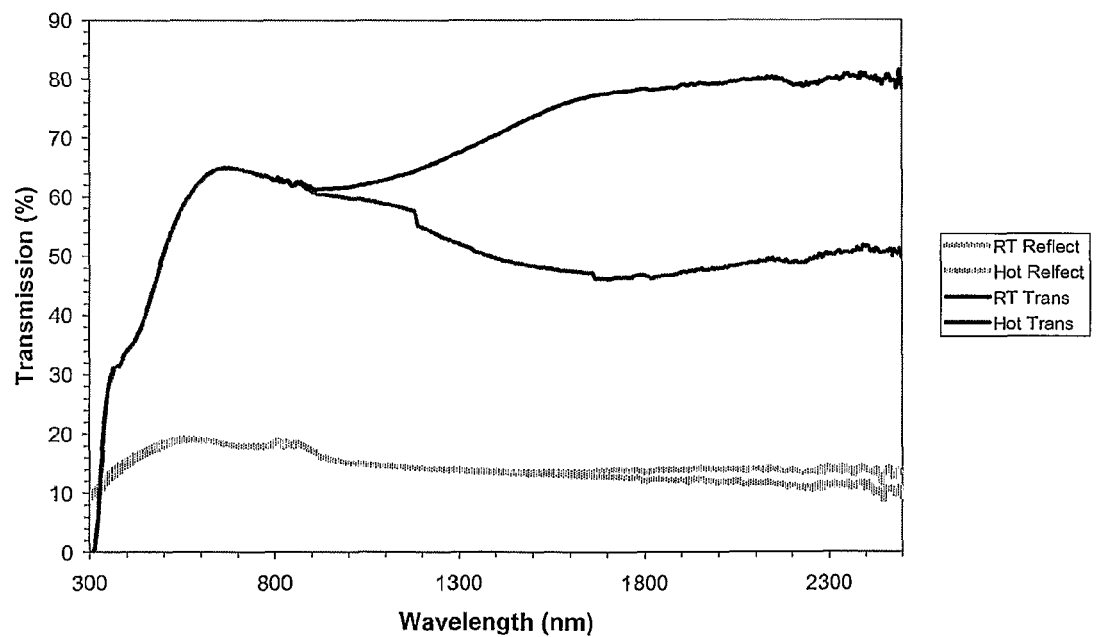
Figure 1C:
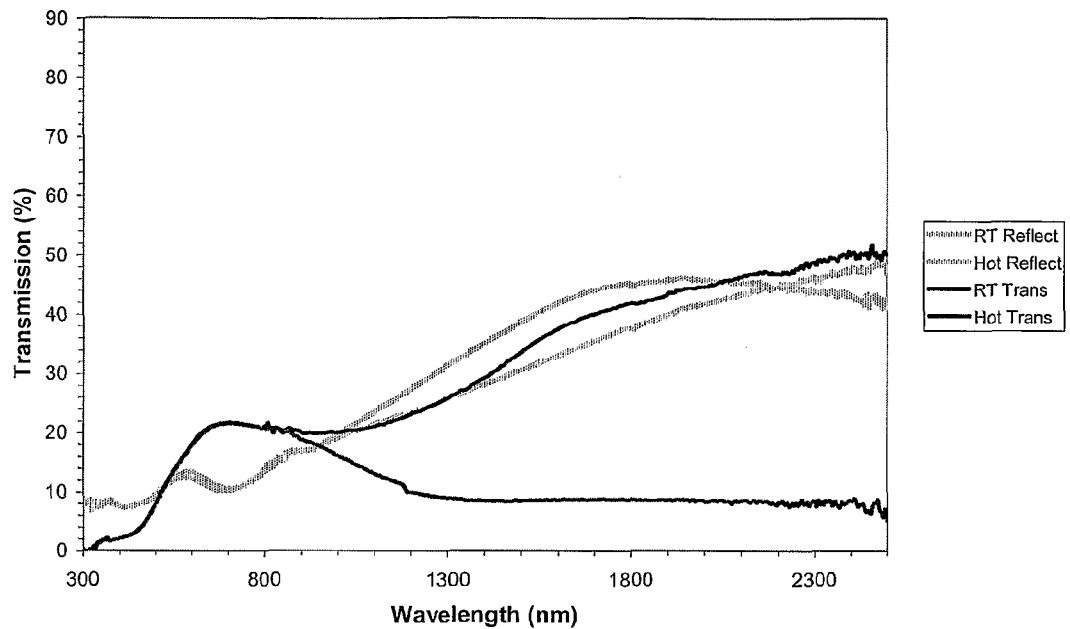

Having determined approximate conditions that produced much higher quality thin films of VO$_2$ than seen in previous research it was thought necessary to determine the change in optical and functional properties with film thickness. Both properties are critical in deploying a coating for use in architectural glass. The functional properties are an essential part of the product but VO$_2$ is a highly coloured material and therefore absorbs in the visible region of the electromagnetic spectrum. To be successfully deployed in architectural glass solutions the overall visible transmission can not be too low, a figure of about 60% optical transmission is considered the minimum necessary that is likely to be viable for the coating to be adopted as a product. Further films were deposited on glass and to vary the film thickness the deposition time was varied between 10 seconds and 90 seconds. Once deposited the films were analysed for optical and functional properties by measuring the room temperature and high temperate transmission and reflectance spectra between 300 and 2500 nm. The film thickness was determined for each film by taking a cross section of the film and examining using SEM. Plots of transmission and reflection of incident radiation on films deposited for 15, 30 and 80 seconds are shown in FIGS. 1A-C, respectively. These times corresponded to films of thickness 30 nm, 65 nm and 150 nm, although an exact measurement was difficult for the thinnest film due to the difficulty in obtaining an accurate image on the SEM.

In terms of optical properties the thinnest film gives the highest optical transmission and the thickest the lowest transmission. The 30 nm film had a peak transmission of 76%, as compared to 86% for plain glass, the 65 nm film had transmission of 65% and the 150 nm film was 22%. This shows that the optical transmission decreases rapidly with increasing thickness. Examining the functional properties show that those also scale with thickness. The thinnest film has an almost negligible change of transmission and reflection properties in the near infrared region. Increasing the film thickness from 30 nm to 45 nm caused a large increase in the size of the transmission switch in the near infrared, to about 30% at 2500 nm, however the reflectance switch remained small. This is surprising because VO$_2$ is alleged to show a large change in reflectance. When the film thickness increased further to 150 nm the transmissive change increased further to 50% but the change in reflection remained very low.

Figure 2:
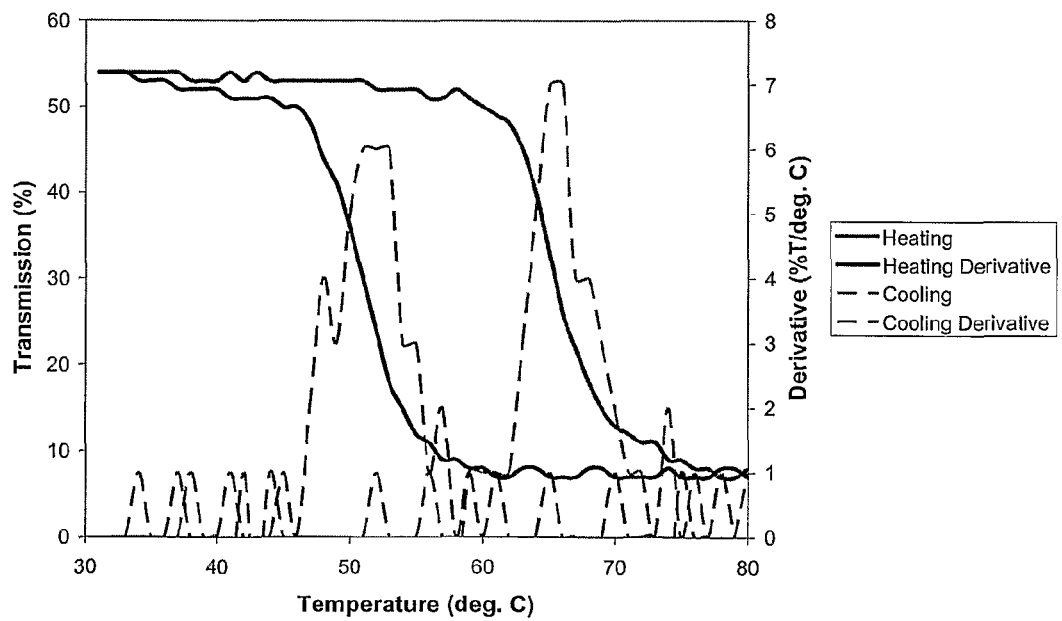
FIG. 2 shows the changes in film transmission at 4000 cm$^{-1}$ (2500 nm) when heated at a rate of 2° C./min and then cooled by switching off the heating and allowing the sample to reach room temperature.

Films with a thickness between 50 and 80 nm showed a response to temperature typified in the chart shown in FIG. 2.

FIG. 2 shows the change in film transmission at 4000 cm$^{-1}$ (2500 nm) when heated at a rate of 2° C./min and then cooled by switching off the heating and allowing the sample to reach room temperature. The derivative shows the rate of change of the transmission, and therefore the peak centres of the derivative peaks show the 'switch' temperature. The heating and cooling curves do not coincide because the rate of cooling was much higher than the rate of heating and the temperature recorded is that of the sample holder, not of the sample itself.

Figure 3A:
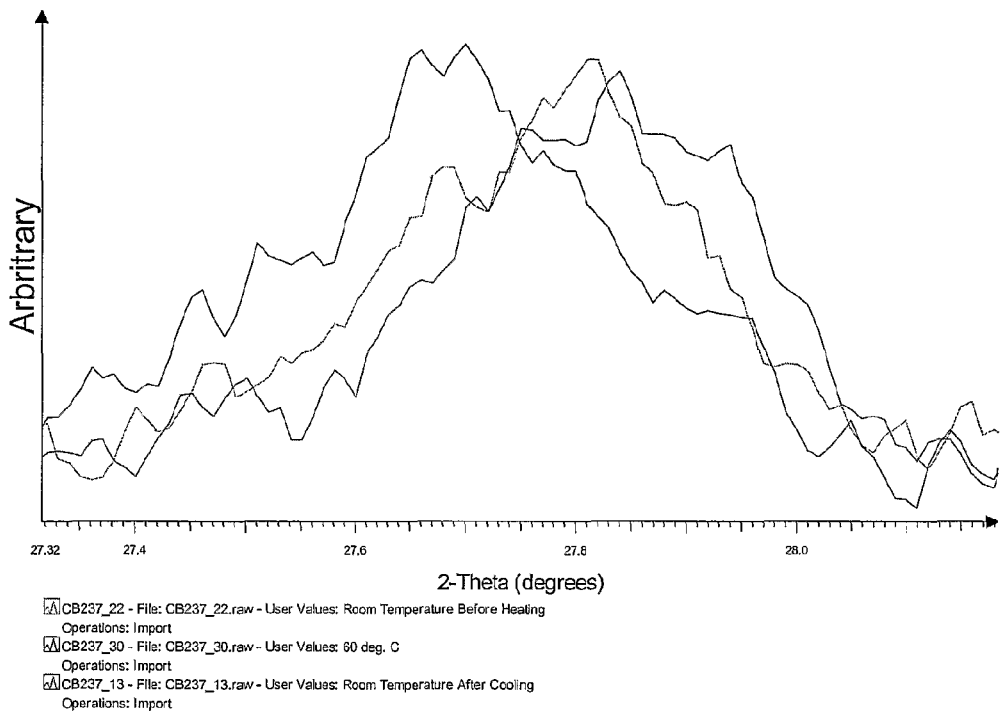
FIGS. 3A and 3B show the examination of the thermochromic switching temperature of films by observing the change in X-ray diffraction on temperature.
Figure 3B:
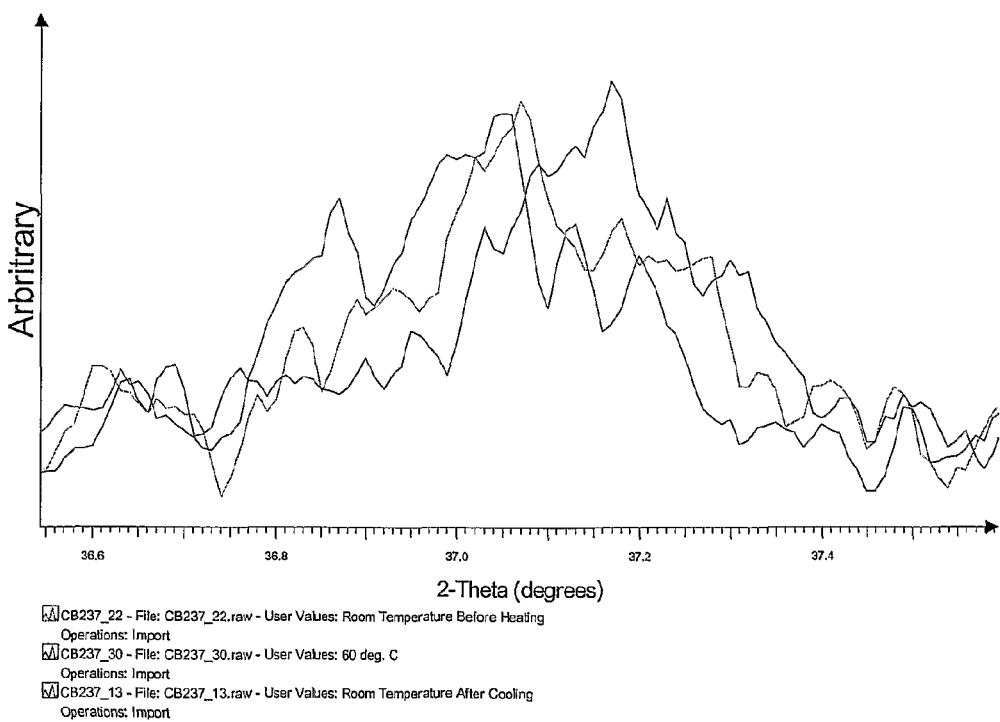

The availability of the GADDS diffractometer meant that it was possible to examine the switching temperature of films by observing the change in X-ray diffraction pattern with temperature. Previously this is something that has only been possible using a synchrotron beam source. X-ray diffraction patterns were taken at 1° C. intervals between room temperature and 70° C., over the range 20 °2θ to 54°2θ, and then again when cooled back to room temperature. FIGS. 3A and 3B show how the peaks at 27 °2θ and 37 °2θ change during heating.

It can be seen that on heating the peak at 27.8 °2θ moves ~0.1 °2θ lower to 27.7. The peak then returns to its initial value on cooling. Similarly the peak at 37.05 °2θ moves 0.1 °2θ higher to 37.15. This change is consistent with the phase change from monoclinic to tetragonal [22].

Figure 4:
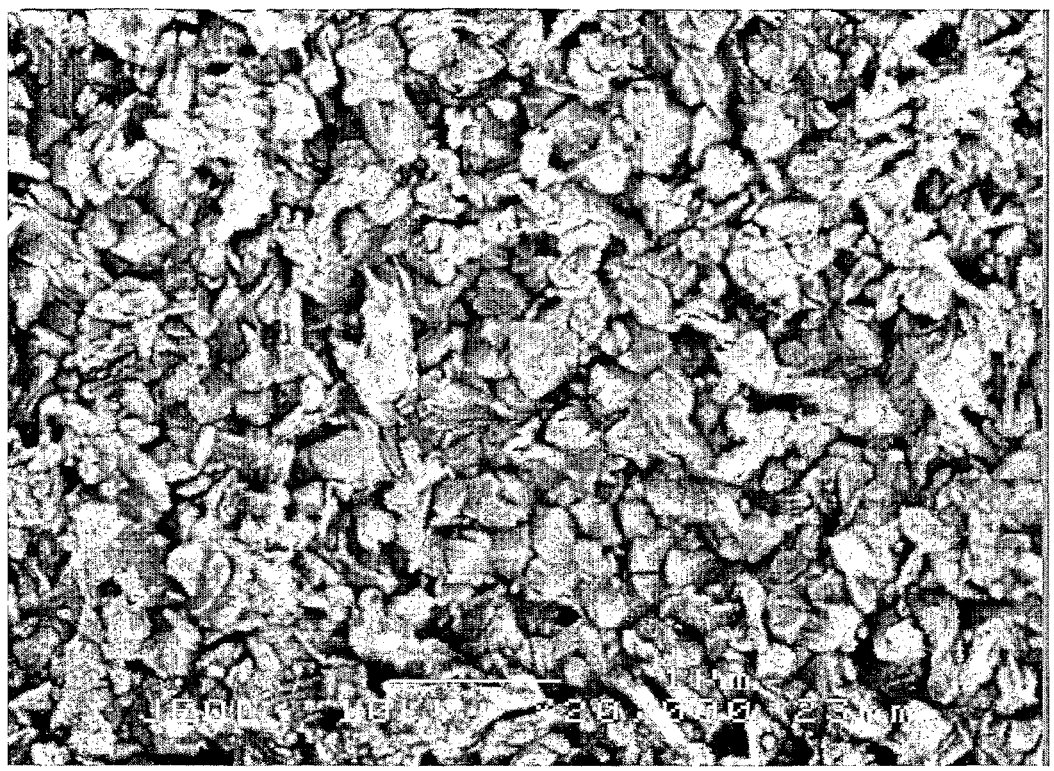
FIG. 4 shows a typical SEM (scanning electron microscope) of a deposited film.

A typical SEM of a deposited film is shown in FIG. 4. The image shows that the film is composed of an agglomeration of irregular particles.

EXAMPLE 3

Optimization

It was necessary to optimize the ratio of water to [VCl$_4$]. The conditions used were identical to previously, that is the [VCl$_4$] bubbler was set to 50° C. with a flow rate of 0.4 L/min N$_2$, a plain flow of 10 L/min, a mixing chamber temperature of 150° C. and a reactor temperature of 550° C. To vary the [VCl$_4$]:H$_2$O ratio the speed of the syringe driver injecting the H$_2$O from a 250 μL syringe was varied (Table 1).

TABLE 1

| | molar flows and reactor concentrations for low, medium and high water conditions | | | | |
|---|---|---|---|---|---|
| System | [VCl$_4$] molar flow rate (mol/min) | Reactor V concentration mol/dm$^3$ N$_2$ | H$_2$O molar flow rate (mol/min) | Reactor O concentration mol/dm$^3$ N$_2$ | [VCl$_4$]:H$_2$O ratio |
| Low Water (CB328) | 0.00044 | 4 × 10$^{-5}$ | 0.0011 | 1 × 10$^{-4}$ | 1:2.5 |
| Medium Water (CB329) | 0.00044 | 4 × 10$^{-5}$ | 0.0013 | 1.2 × 10$^{-4}$ | 1:3 |
| High Water (CB322) | 0.00044 | 4 × 10$^{-5}$ | 0.0018 | 1.6 × 10$^{-4}$ | 1:4 |

Upon carrying out these reactions it was noticed immediately that the appearance of the films changed. The film deposited using low amounts of water was brown in appearance and was particulate with poor adhesion to the substrate, the film being abraded by the action of a paper towel. The film deposited with the medium water system was adherent and glassy and could not be abraded with a towel, and whilst being brown there was a green-grey tint in transmission. The high water system deposited a more notably green film. To quantify the effect the films were analysed using a UV/vis spectrometer, as shown in FIG. 5.

Figure 5:
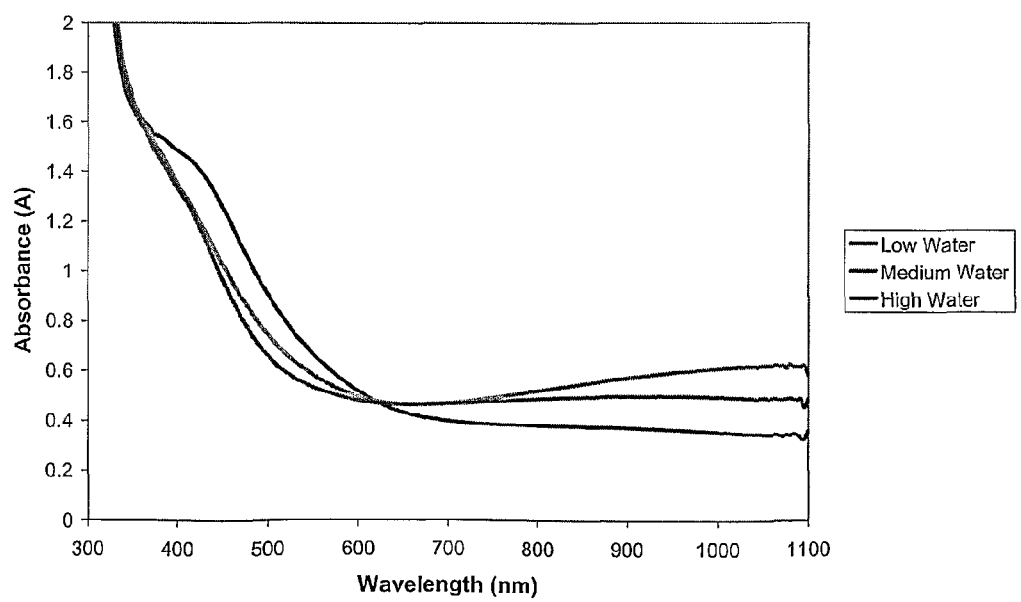
FIG. 5 shows a plot from a UV/vis spectrometer measuring absorbance of films produced under low, medium and high water conditions.
Figure 6:
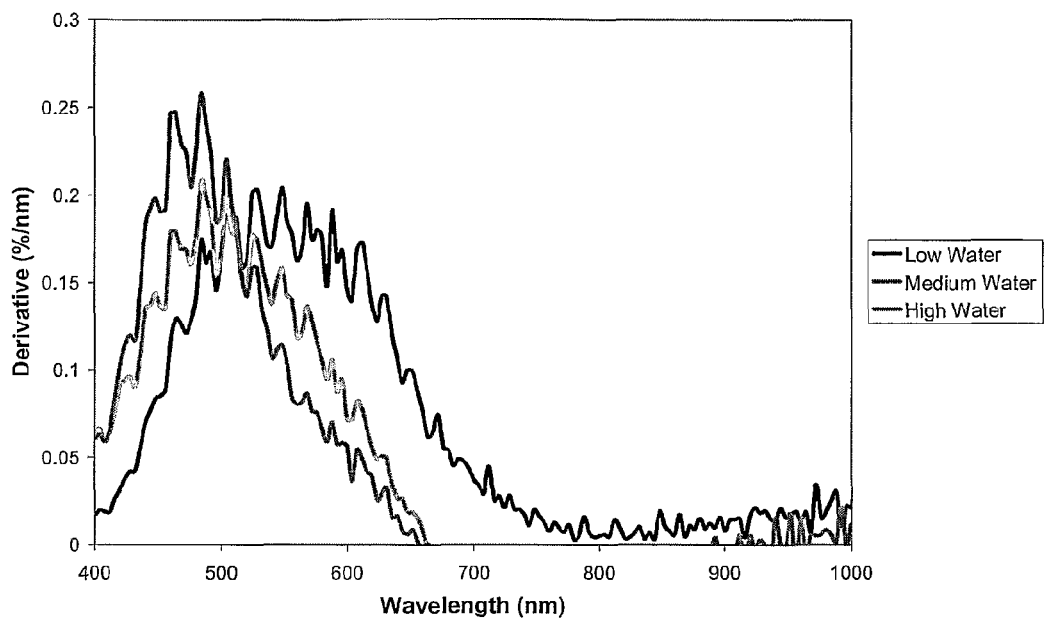
FIG. 6 is a plot of the derivative of the transmission data against wavelength for all data found on the films produced under low, medium and high water conditions.

It is apparent from FIG. 5 that the absorbance profiles for the films deposited under low, medium and high water regimes are different, most notably for the low water system. It was found instructive to plot the derivative of the % Transmission data against wavelength for all data found. The plot, FIG. 6, shows the rate of change of the optical transmission and seemed to suppress thickness effects.

This plot was found to be useful as a gauge of the films colour. All films deposited under a low water regime and visually described as brown had a profile almost identical to the one shown, similarly for the other regimes.

Figure 7A:
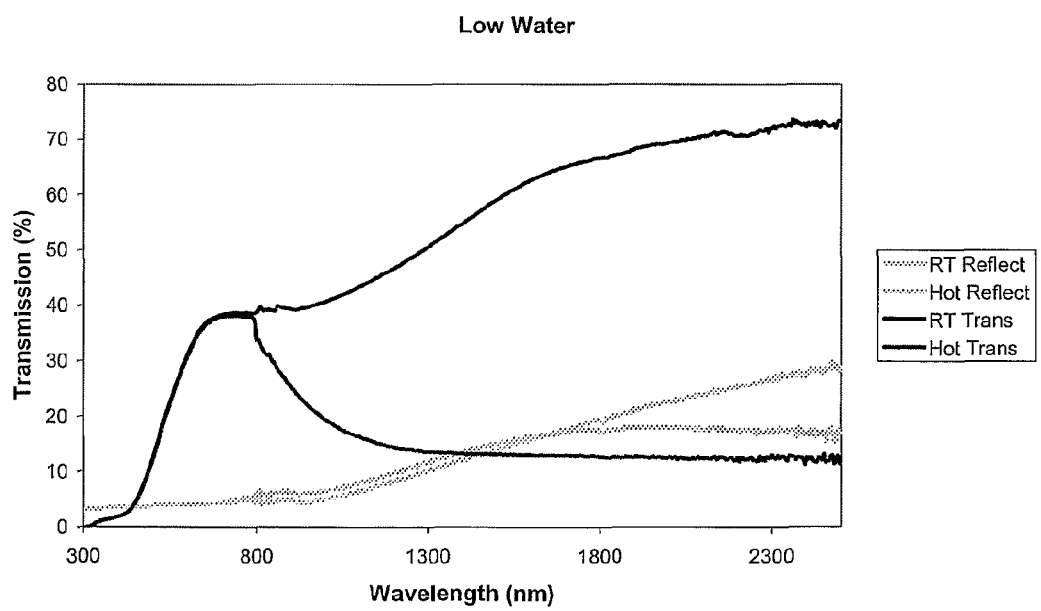
FIGS. 7A-C shows the plots of transmission and reflection of incident radiation on films produced under low, medium and high water conditions, respectively, at both room temperature and at a temperature above the thermochromic switching temperature.
Figure 7B:
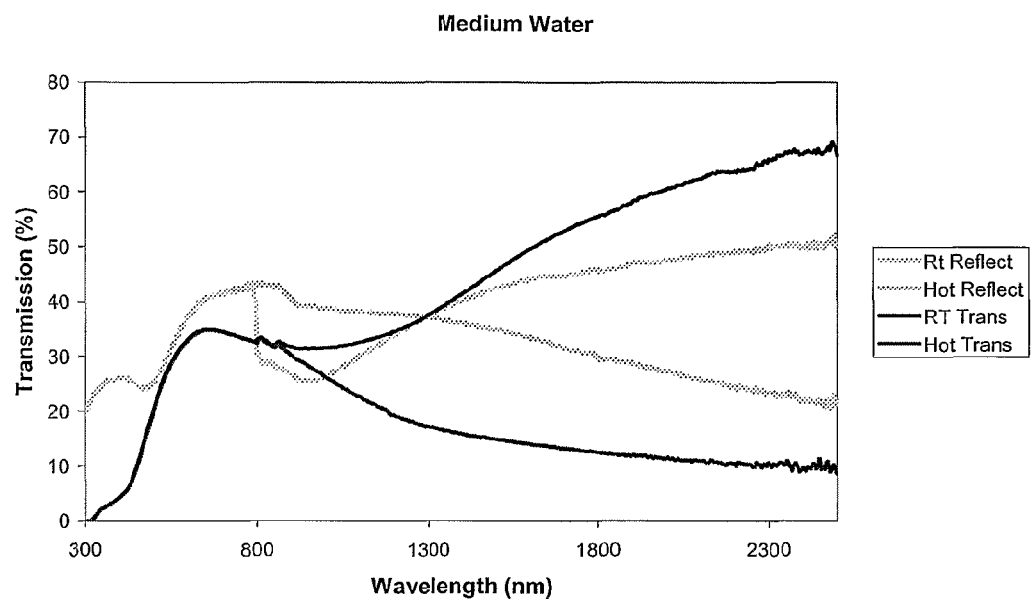
Figure 7C:
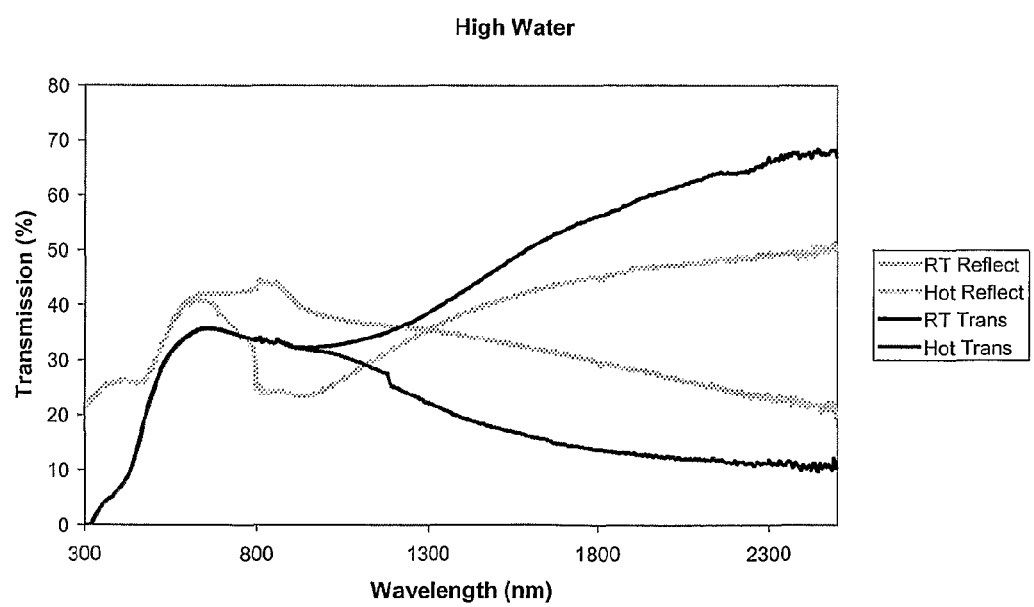

To characterize the colour further full transmission and reflection data were obtained for the samples before and after switching. The results are shown in FIGS. 7A-C.

The most obvious difference between the spectral data is the change in the size of the reflection between the low water sample and those with medium and high water. The low levels of reflection observed for the low water sample correlate with the powdery granular appearance of these films, whereas the films deposited using higher water ratios were glassy, adherent and reflective, which is supported by the measurements. These charts typify the behaviour of deposited films in the [VCl$_4$]:H$_2$O range 1:2 to 1:5, with a total change in transmission of ~50% being measured. However films using very high ratios of water to [VCl$_4$] typically displayed higher overall transmission at 2500 nm and the size of the switch began to decrease. The increase in overall transmission and the loss of the thermochromic switch was attributed to the formation of V$_2$O$_5$, although this was not confirmed LBNL Window and Optic software was used to calculate the colour co-ordinates of the films in transmission (Table 2).

TABLE 2

| colour co-ordinates of the films in transmission | | | | |
| --- | --- | --- | --- | --- |
| Conditions | L* | a* | b* | Colour |
| Low Water | 54.21 | 9.56 | 45.89 | |
| Medium Water | 59.59 | 0.84 | 34.89 | |
| High Water | 61.76 | −1.27 | 29.25 | |

Reactions carried out with a lower water fraction than shown in the table gave less and less substrate coverage, until at a [VCl$_4$]:H$_2$O ratio of 1:1 or less no film was deposited. Films carried out with higher and higher levels of water became more and more green in appearance.

EXAMPLE 4

Tungsten Doping

The conditions required to give W-doped VO$_2$ thin films with switching temperatures near room temperature were then examined. Undoped VO$_2$ thin films produced by this method had an approximate switching temperature in the range 55-60° C., in accordance with previous studies [16]. To produce W-doped thin films identical conditions were used as for undoped films, except [WCl$_6$] was introduced into the gas stream (Table 3). Previous work had vaporised [WCl$_6$] at a bubbler temperature of 240° C., near the melting point of [WCl$_6$] (~275° C.). However this can cause problems in use, since it is impossible to keep all parts of the CVD apparatus above the melting point and this can quickly lead to blockages. This problem is alleviated by using high N$_2$ carrier flow rates but this would lead to large amounts of tungsten carry over at the temperature referred to above. The amount of [VCl$_4$] used during the current series of experiments was far less than used in previous work [21] so it was determined that the amounts of tungsten required in the gas phase were likely to be much lower, also. The N$_2$, flow rate through the [WCl$_6$] bubbler was set to 2 L/min and the temperature of the bubbler varied between 100° C. and 195° C. to change the amount of tungsten in the gas phase. The syringe used in these experiments was the 1000 µL syringe. The amount of tungsten in the resultant films was characterized using WDX over a number of spots on the film surface. Switching temperatures were determined by measuring the approximate temperature of the thermochromic switch at 4000 cm$^{-1}$ for those films with switching temperatures above room temperature (±5° C.) or by using variable temperature Raman spectroscopy to determine those at or below room temperature (±2.5° C.).

TABLE 3

| [WCl$_6$] bubbler conditions | | | |
| --- | --- | --- | --- |
| [WCl$_6$] Bubbler Temperature (° C.) | Reactor W concentration mol/dm$^3$ N$_2$ | % W in film - value (standard deviation) | Switch Temperature (° C.) |
| no [WCl$_6$] used in reaction (cb274) | | 0.11 (0.06)+ | 55 (±5) |
| 100 (cb269) | | 0.11 (0.08) | 55 (±5) |
| 100 (cb270) | 7 × 10$^{-7}$ | 0.12 (0.10) | 55 (±5) |
| 110 (cb271) | | 0.28 (0.11) | 50 (±5) |
| 120 (cb272) | | 0.64 (0.06) | 45 (±5) |
| 130 (cb273) | 4 × 10$^{-6}$ | 1.56 (0.36) | 20 (±2.5) |
| 152 (cb250m) | | 1.75 (0.29) | 5.5 (±2.5) |
| 165 (cb252) | | 3.00 (1.89) | −15.5 (±2.5) |
| 177 (cb253) | | 3.56 (0.71) | −19.0 (±2.5) |
| 195 (cb255) | 1.3 × 10$^{-4}$ | 8.20 (0.93) | −28 (±2.5) |

+indicates size of error of instrumental analysis

Figure 8:
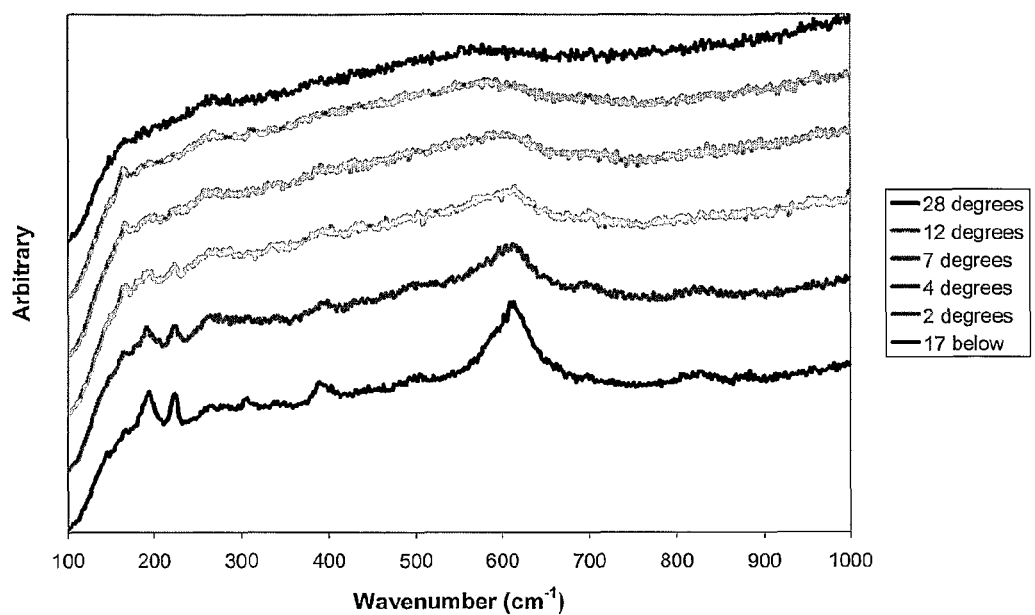
FIG. 8 shows a Raman spectroscopy plot showing the behaviour of a film at different temperatures.

A typical example of the variable temperature Raman data is shown in FIG. 8.

The transition is easy to characterize using Raman spectroscopy. The low temperature phase has a number of clear bands in its Raman spectrum. The high temperature phase has no easily discernible bands. In the example shown above the transition occurs somewhere between 4 and 7° C., i.e. it is 5.5 ±1.5° C.

Figure 9:
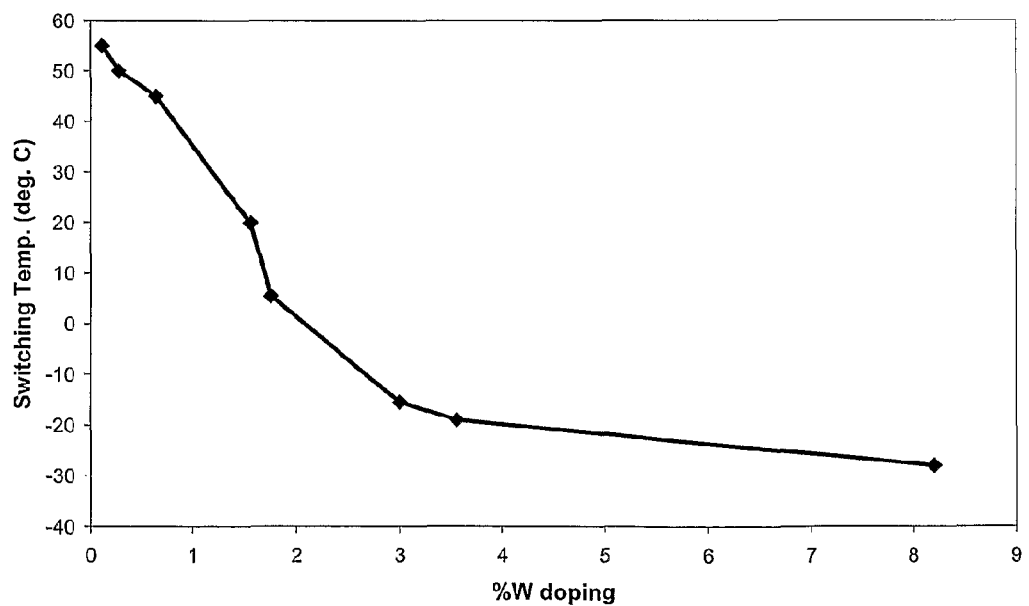
FIG. 9 shows a plot of switching temperature against % tungsten doping.

A graph of switching temperature against the % tungsten doping of the film is shown in FIG. 9.

The data shows that the maximum doping level achieved during these experiments was around 8%. This led to a switch temperature of −28° C.

Figure 10:
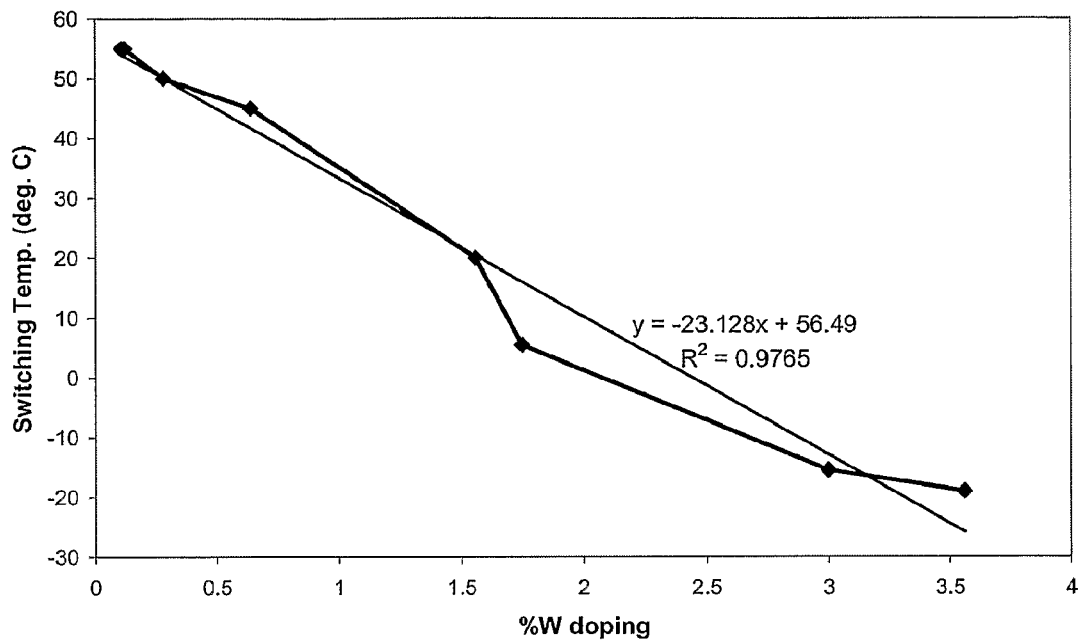
FIG. 10 shows a plot of switching temperature against % tungsten doping over a smaller range of % tungsten doping.

Previous work had shown a linear relationship between the level of tungsten doping and the switching temperature, with an approximate 20° C. change per 1% tungsten doping. However this was only up to around 3% tungsten loads. A plot was made of % tungsten doping against switching temperature was made with only data in this range and is shown in FIG. 10.

The graph shows a relationship between tungsten doping and transition temperature that appears to be near linear, with a 23° C. change per % tungsten doping, which is close to the values found in the previous research. The intercept is 56.49° C., suggesting that an undoped film should have a switching temperature near this value, which is confirmed by the data in Table 3.

Figure 11:
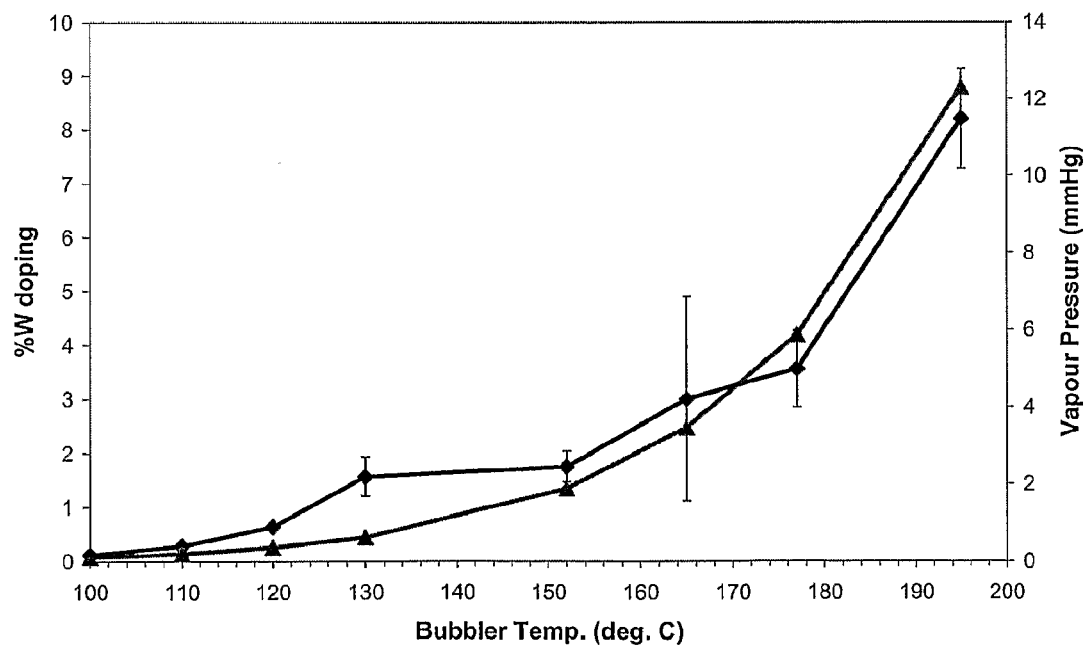
FIG. 11 shows the % tungsten doping in films of the invention as a function of the tungsten bubbler temperature.

A plot was made of the change in tungsten doping with bubbler temperature and is shown in FIG. 11.

The vapour pressure curve for [WCl$_6$] over the same temperature range is shown against the second y-axis. It is clear that the level of tungsten doping in the film increases in an exponential fashion with increasing bubbler temperature. It is also clear that the curve for the increase in tungsten in the film follows the curve for increase in [WCl$_6$] vapour pressure closely. This suggests that all of the extra [WCl$_6$] in the vapour phase, caused by the increase in bubbler temperature, is deposited into the film, or at least the fraction of [WCl$_6$] deposited as tungsten in the film is the same at low [WCl$_6$]:[VCl$_4$] mole ratios (low [WCl$_6$] bubbler temperature) as at high [WCl$_6$]:[VCl$_4$] ratios (high bubbler temperature).

A function of the addition of tungsten to the films was a change in the visible colour of the reflection. An undoped film appeared green/brown in reflection but a tungsten doped film appeared a much more aesthetically pleasing silver/blue in reflection (Table 4).

TABLE 4 colour co-ordinates of the films in transmission

| Tungsten Doping (%) | L* | a* | b* | Reflection Colour |
|---|---|---|---|---|
| 0.0 | 40.64 | 0.80 | 11.94 | |
| 0.64 | 48.86 | -2.36 | 6.18 | |
| 3.56 | 42.33 | -0.71 | -6.53 | |

Figure 12A:
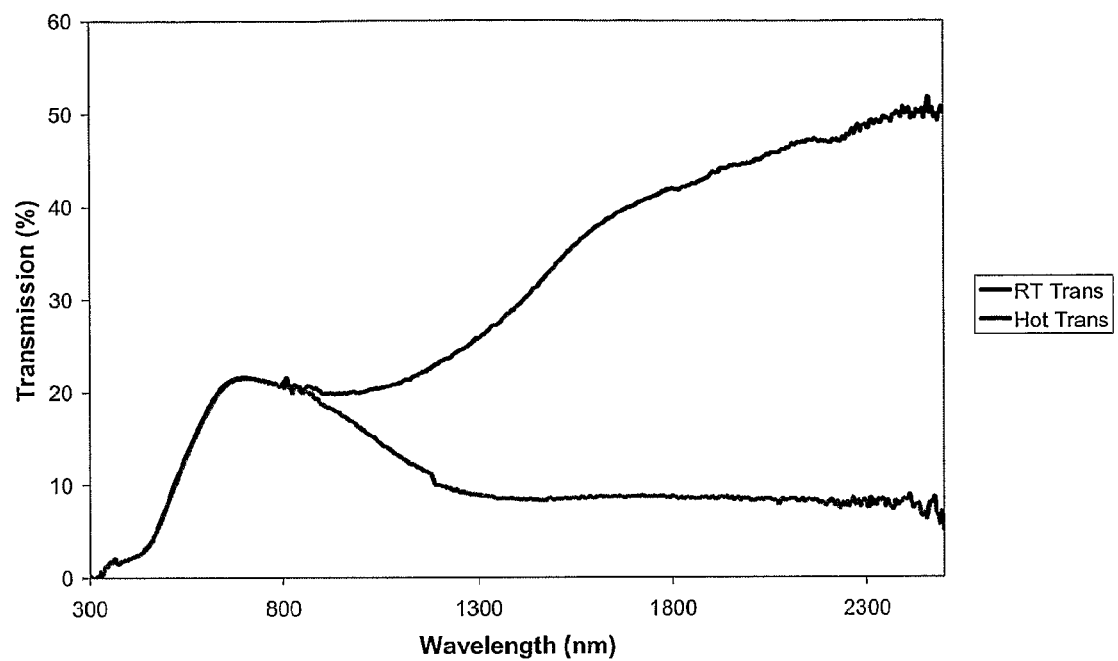
FIGS. 12A-C show the % transmission of incident radiation on films having no tungsten (12A), 0.64% tungsten (12B) and 3.56% tungsten (12C) above and below their thermochromic switching temperatures.
Figure 12B:
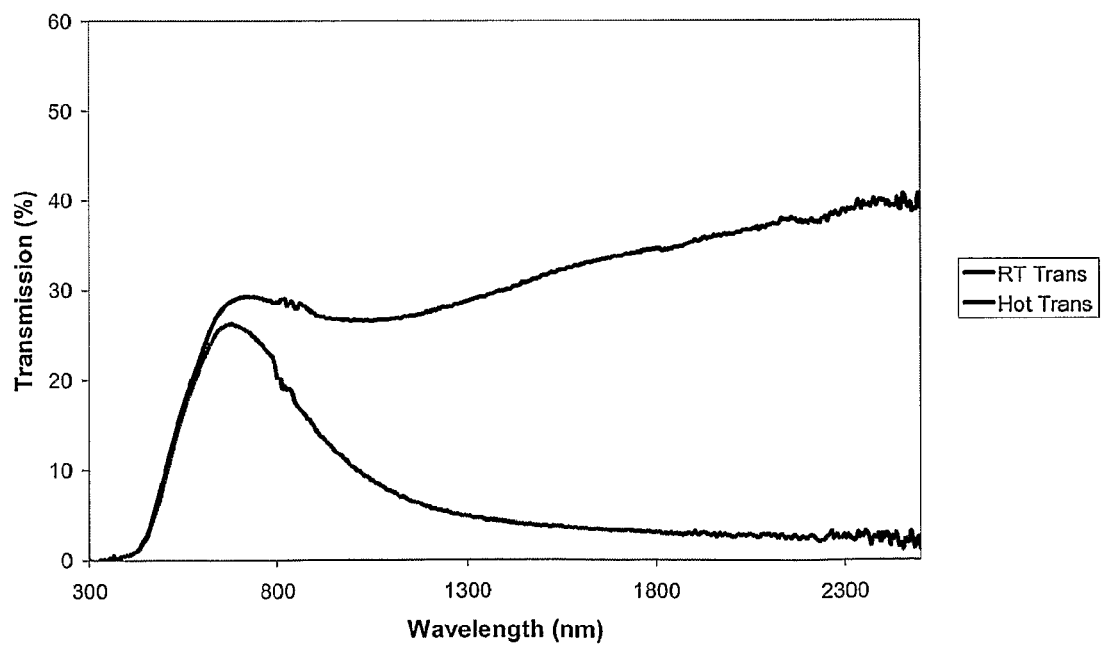
Figure 12C:
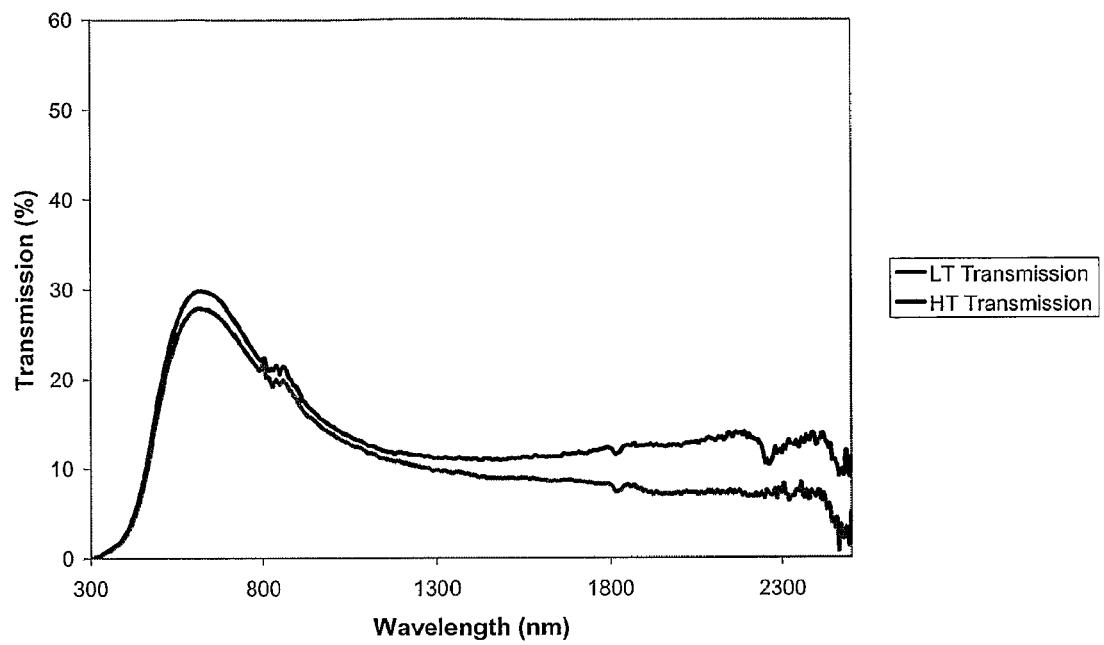

Another function of tungsten doping is that it modifies the transmission profile in the near infrared. With no tungsten doping the transmission shows a large increase in transmission in the near infrared at room temperature, relative to the optical transmission (FIG. 12A). The size of the switch at 2500 nm is about 50%. On adding tungsten to the level of 0.64% the transmission in the near infrared remains relatively flat compared to the optical transmission (FIG. 12B). The size of the switch remains high, at around 45%. On further tungsten doping to 3.56% the profile of the near infrared transmission changes dramatically (this sample was cooled to obtain the low temperature transition) (FIG. 12C). The transmission in the near infrared is now far lower than the optical transmission and the change in transmission at 2500 nm is not much smaller at between 5 and 10%. In all of these films the reflection values were approximately 45% at room (cooled) temperature and showed a switch in reflection of around 20% in each case. In other words tungsten doping not only changed the temperature of the transition it changed the size of the switch measured in transmission, whilst not appreciably changing the size of the reflection change.

Figure 13:
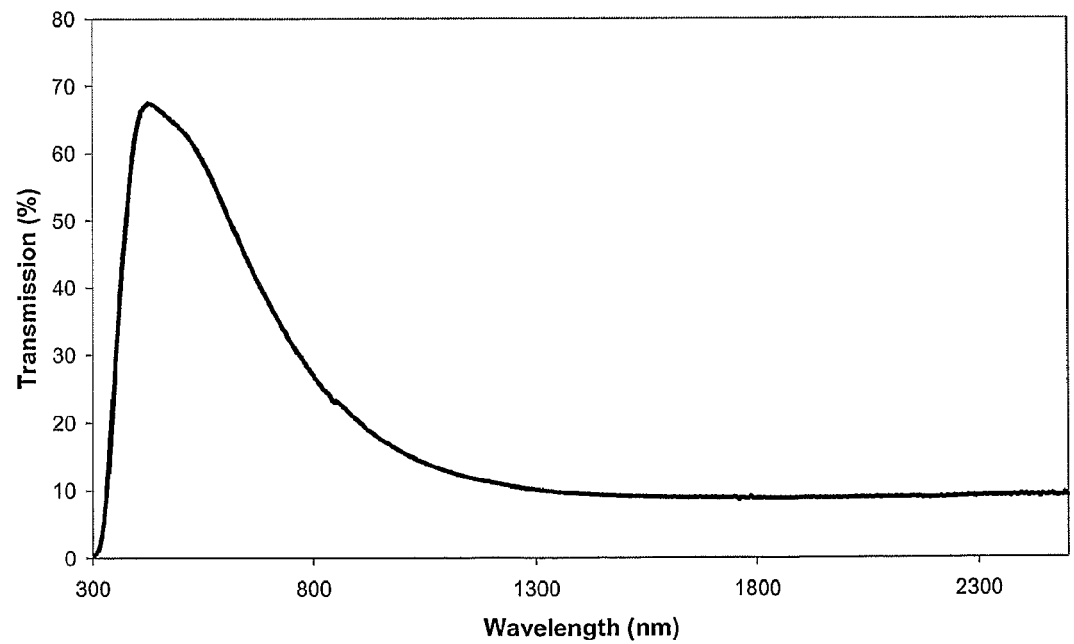
FIG. 13 shows the % transmission of incident radiation of tungsten (VI) oxide.

A graph of the transmission of tungsten (VI) oxide, WO$_3$, is shown in FIG. 13. This graph shows a striking similarity to the transmission profile seen for the film with a relatively high tungsten loading. It was thought possible that the formation of discrete tungsten oxide in the VO$_2$ film, as opposed to tungsten doping of the VO$_2$ may have given rise to this effect.

Figure 14A:
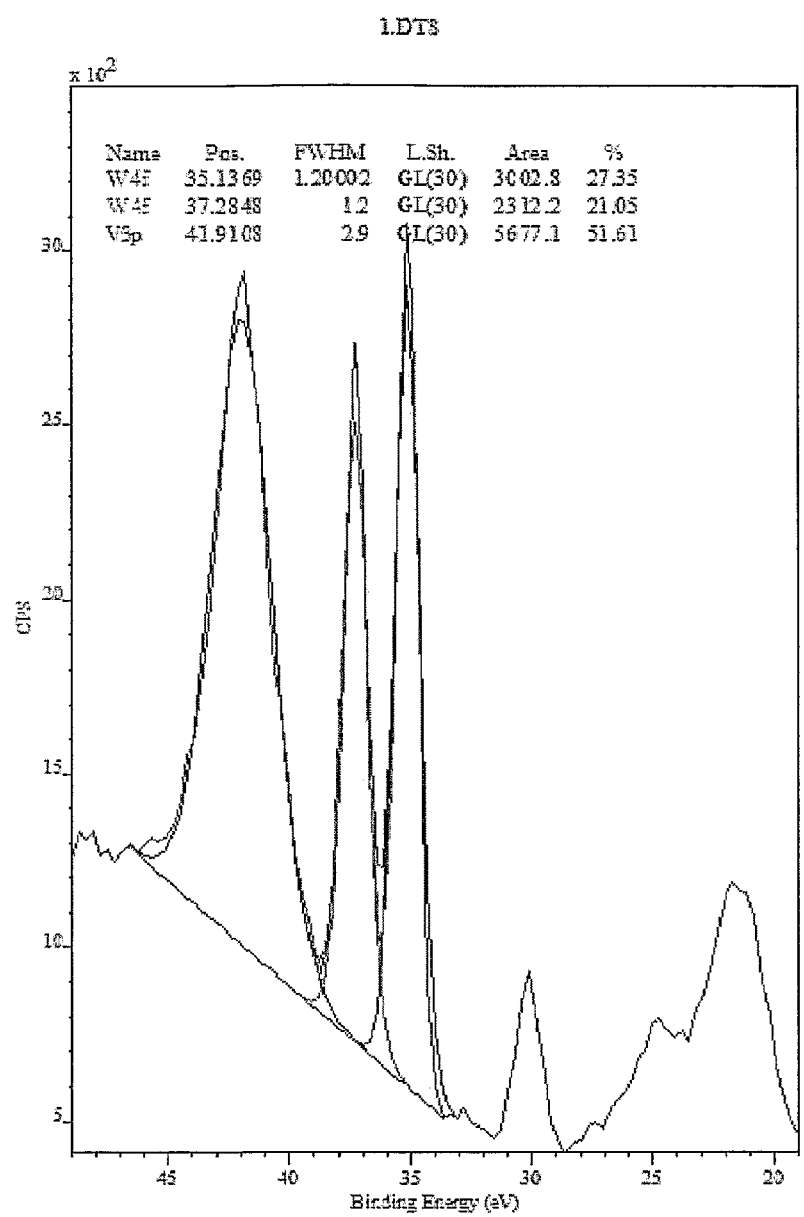
FIGS. 14A-C shows XPS plots of an undoped film (14A), a film having 1.75% tungsten (14B) and a film having 8.20% tungsten (14C).
Figure 14B:
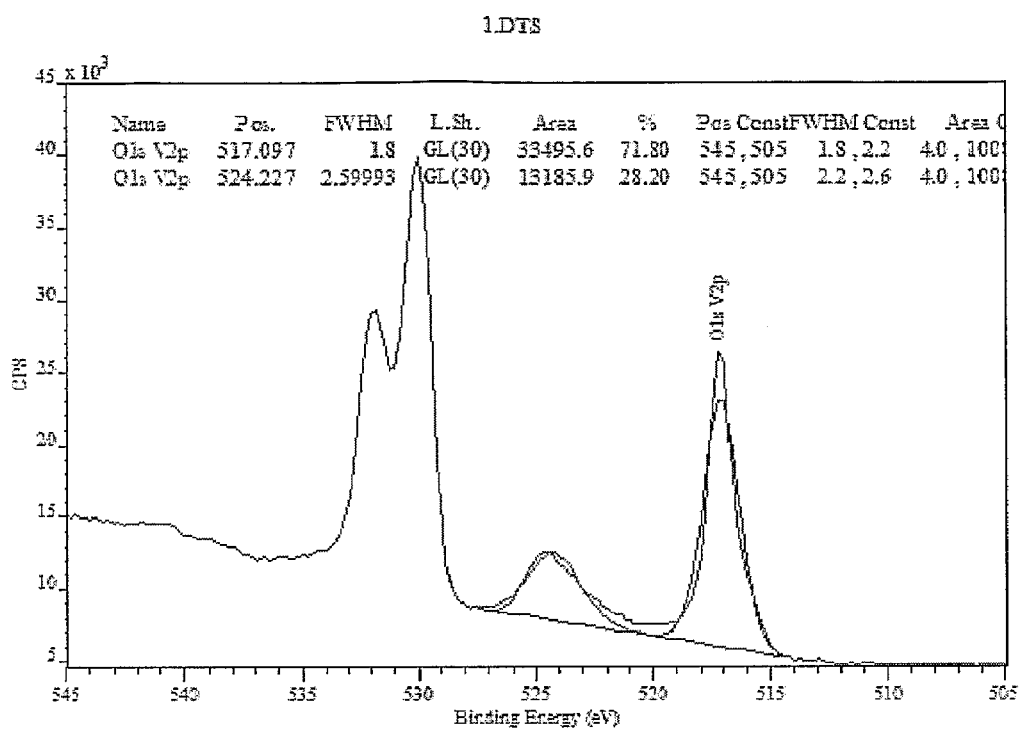
Figure 14C:
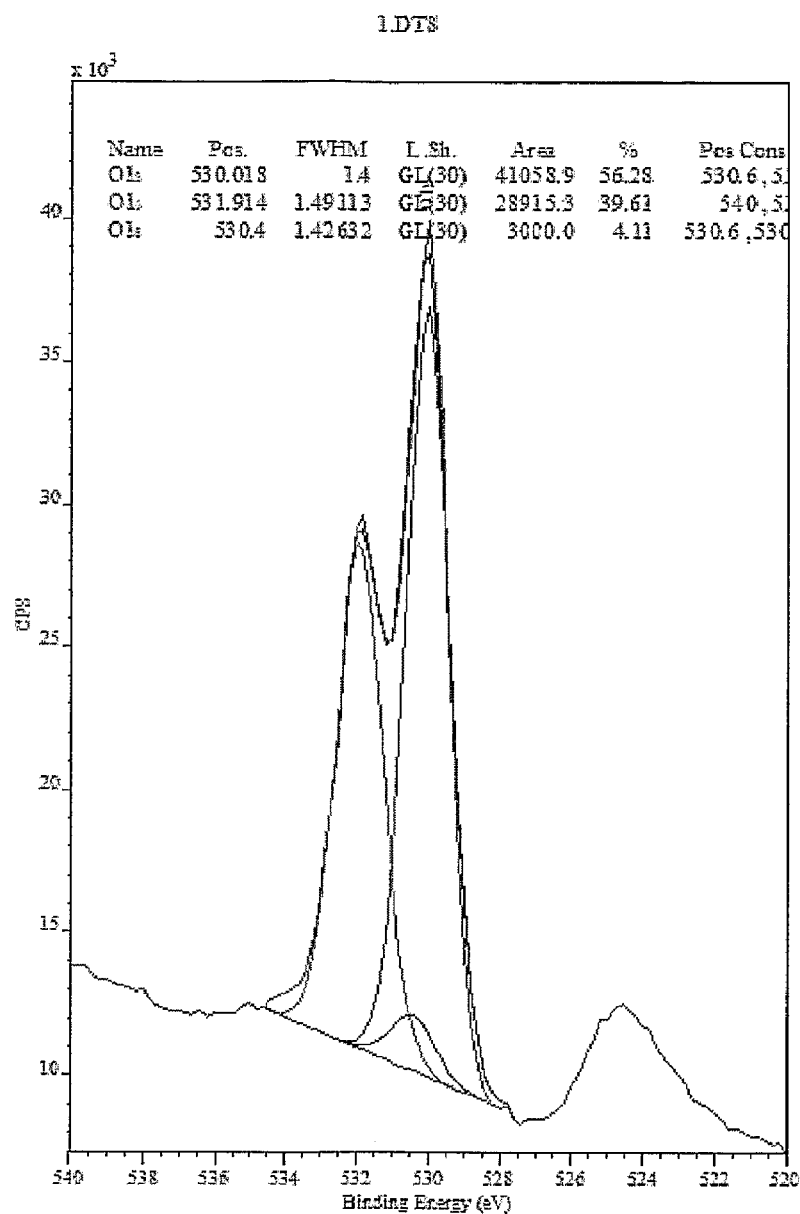

The form of the tungsten oxide was examined to determine whether the change in transmission profile was as the result of tungsten doping or the formation of a combined VO$_2$/WO$_3$ film. X-ray diffraction showed no obvious difference in X-ray crystalline phases between doped and undoped films. Similarly, Raman showed no other phase other than crystalline VO$_2$. Hence XPS was used to examine undoped films (FIG. 14A), a film with a dopant level of 1.75% (FIG. 14B), as determined using WDX, and one with a dopant level of 8.20% (FIG. 14C) as determined using WDX.

Figure 15A:
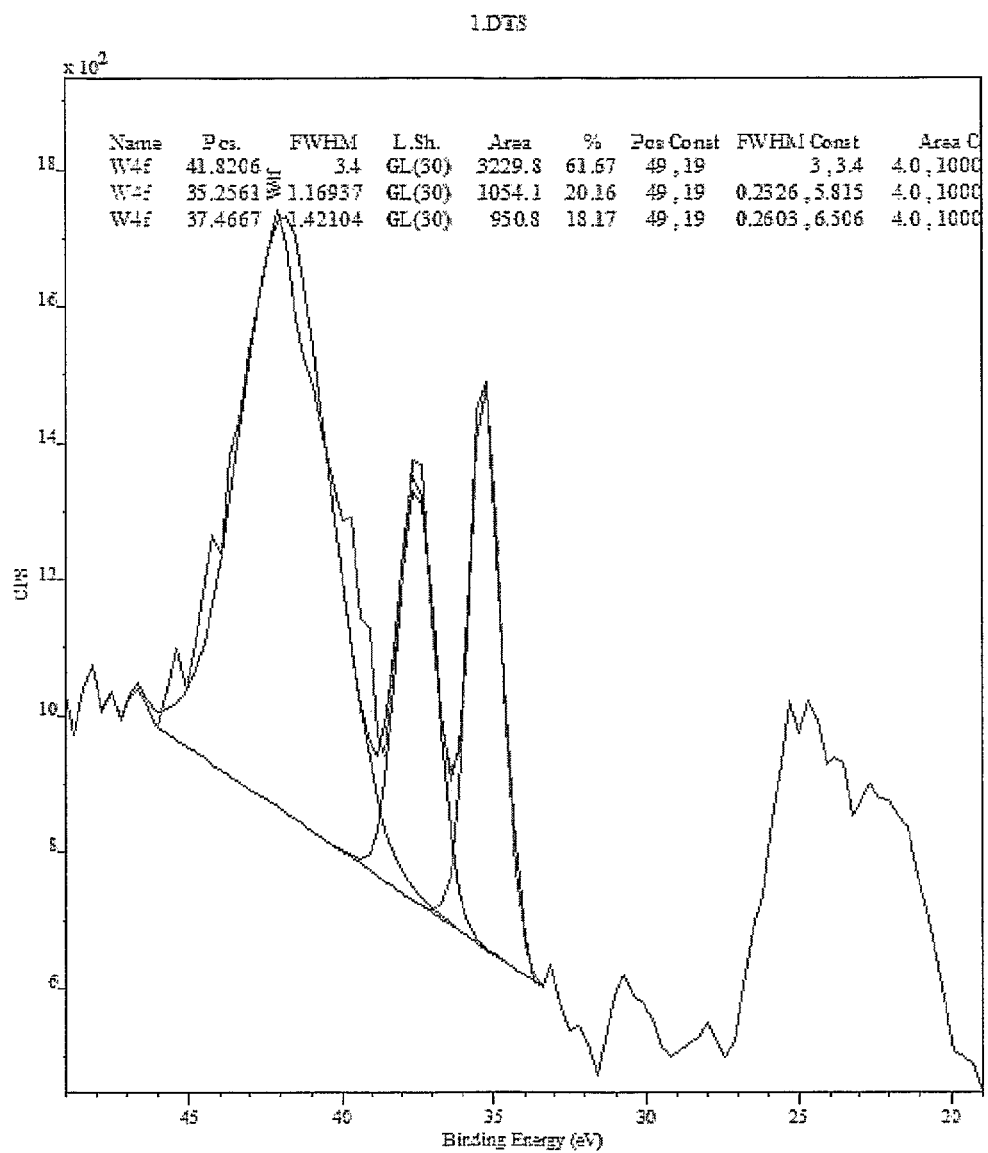
FIGS. 15A-C show de-convolution of the W 4f/V3p (FIG. 15A), V 2p (FIG. 15B) and O 1s (FIG. 15C) regions of the surface XPS spectrum of the film with a nominal 8.20% doping level.
Figure 15B:
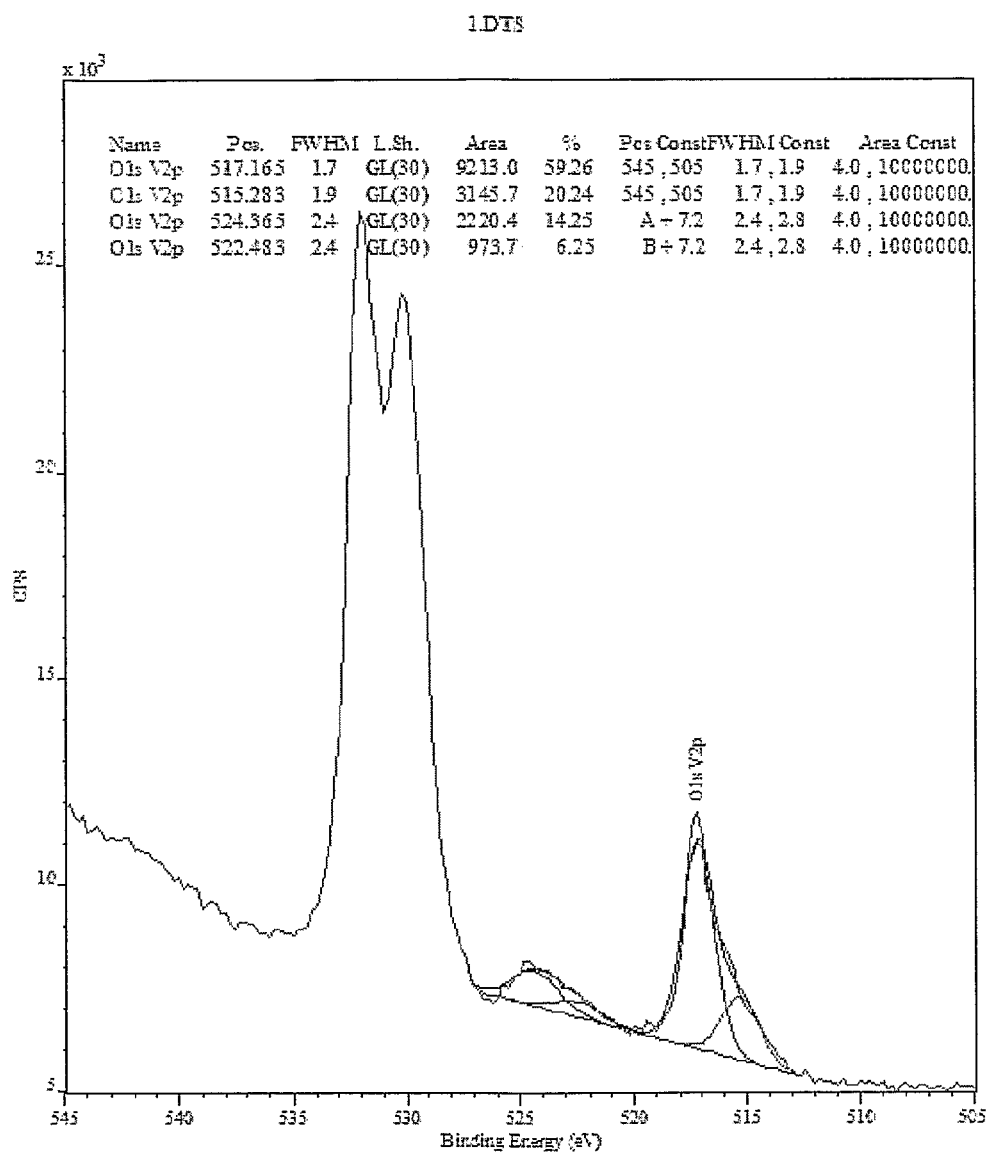
Figure 15C:
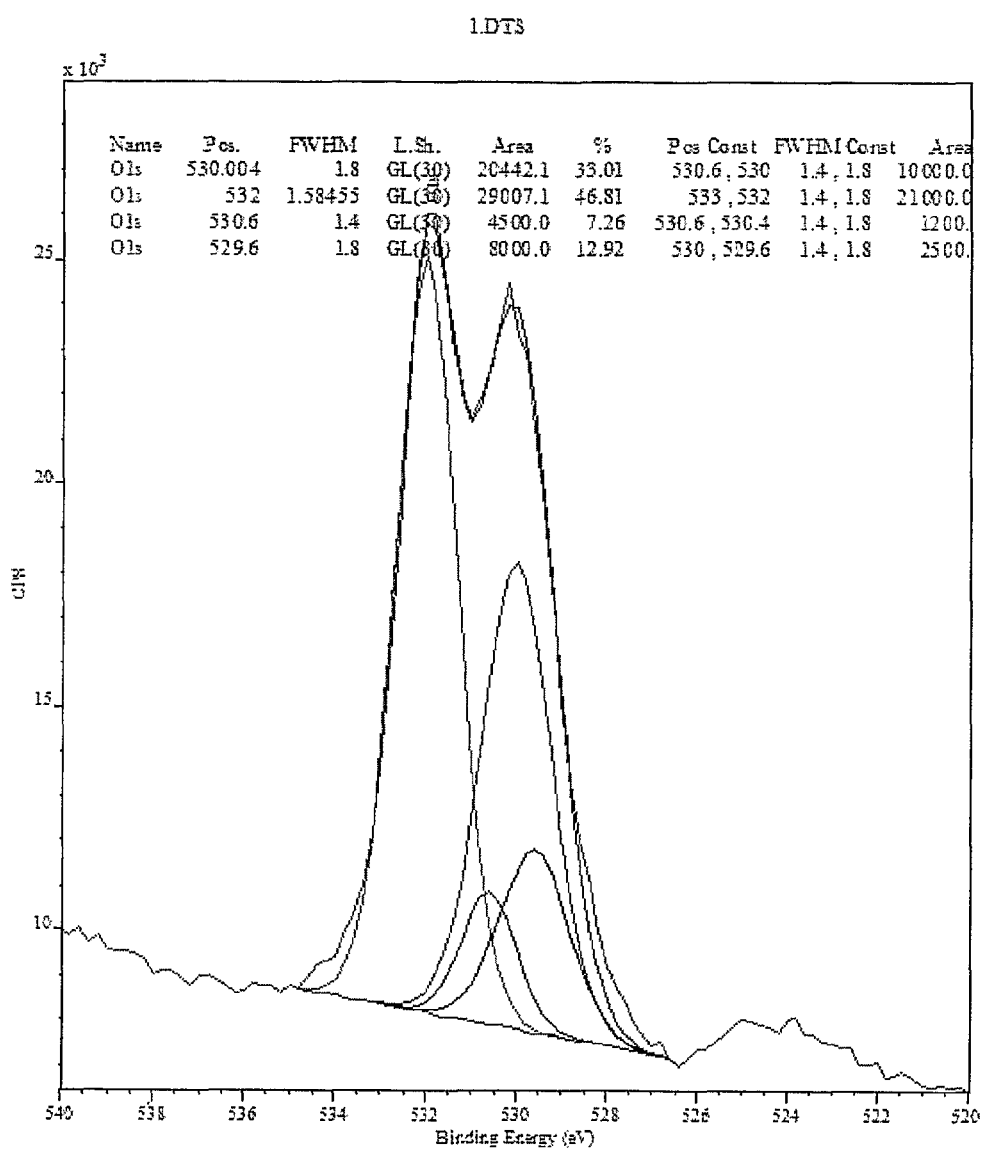

De-convolution of the W 4f/V3p (FIG. 15A), V 2p (FIG. 15B) and O 1s (FIG. 15C) regions of the surface XPS spectrum of the film with a nominal 8.20% doping level revealed one dominant V 3p ionization at 41.9 eV, which equates to V$_2$O$_5$. The presence of V$_2$O$_5$ and not VO$_2$ was confirmed by the V 2p region, which showed a single chemical environment with V 2p$_{3/2}$ of 517.1 eV. The oxidation of VO$_2$ to V$_2$O$_5$ at the film surface is entirely expected. The W 4f$_{7/2}$ ionization at 35.1 eV corresponds to W (VI), this could either be in the form of WO$_3$ or as doping of W (VI) into VO$_2$. Measurement of the peak area ratios indicated that there was 7.14% W as a fraction of V present in the film. However de-convolution of the O 1s region showed that to get the correct peak area ratios for the peaks associated with SiO$_2$ (531.9 eV) and V$_2$O$_5$ (530.0 eV) a third peak needed to be added at 530.4 eV, which corresponds to an O is ionization associated with WO$_3$. This would appear to indicate that most, if not all, of the W (VI) is bound to oxygen in the form of WO$_3$.

Deconvolution of the peaks for the sample with a tungsten level of 1.75%, determined using WDX, showed the presence of two surface V 2p$_{3/2}$ ionizations, one at 517.1 eV assigned to V$_2$O$_5$ and a much smaller one at 515.3 eV attributed as VO$_2$. In this case the surface had not been completely oxidized to V$_2$O$_5$. Tungsten was again present with a 4f$_{7/2}$ ionisation at 35.2 eV, which is due to W (VI). Deconvolution of the O 1s region was complicated, it was found that if O 1s ionizations were introduced in relation to the VO$_2$, V$_2$O$_5$, WO$_3$ and SiO$_2$ components then the correct peak shape was obtained but the modelled intensity was approximately half the measured intensity. On examining the spectra it was noticed that there was a large amount of carbon on the surface, in three separate environments. It was considered that the intensity of the analysed peaks, particularly for V and W, was very low probably due to the large amount of surface carbon. The backgrounds in these peak regions were also heavily sloping making an absolute accurate quantification of these peaks difficult. Unfortunately if V/W films are etched both the V and W peaks are subject to changes in oxidation caused by Ar$^+$ ions, and therefore quantification of the V and W environments is impossible. The only conclusion that can be reached from these data therefore is that W (VI) was present in the film, with the likelihood that much of it was bound in the form of WO$_3$.

EXAMPLE 5

Having conducted this work it was found that the CVD chemistry became easily controllable. Having seen that the change in infrared reflectivity had been small it was thought this may be attributable to a microstructural effect. To manipulate the microstructure it was decided to alter the reaction conditions to provide films of a similar thickness but that were deposited over differing periods. To achieve this, the [VCl$_4$] and H$_2$O reactant amounts were altered to reflect changes in the deposition time (Table 5). To replicate the conditions used in previous experiments the CVD line that had been used to supply [WCl$_6$] was opened at 2 L/min, however the flow was not diverted through the bubbler. It transpired that all the films deposited contained tungsten. It was thought that this contamination must come from contamination of the [WCl$_6$] line, and opening this line during reaction caused [WCl$_6$] to be input into the reactor. The temperature of the lines was held at 100° C., therefore the [WCl$_6$] flow rate in the table below has been estimated as though the N$_2$ flow was directed through the [WCl$_6$] bubbler held at 100° C.

TABLE 5 vanadium, oxygen and tungsten molar ratios and concentrations

| Deposition time (minutes) | [VCl$_4$] flow rate (:ratio to flow in 1 minute) - ×10$^{-5}$ mol/min | Reactor V concentration mol/dm$^3$ N$_2$ | H$_2$O flow rate (:ratio to flow in 1 minute) - ×10$^{-4}$ mol/min | Reactor O concentration mol/dm$^3$ N$_2$ | [WCl$_6$] flow rate - ×10$^{-5}$ mol/min | Reactor W concentration mol/dm$^3$ N$_2$ | [VCl$_4$]:H$_2$O (:[WCl$_6$]) ratio | % W (as proportion of V) |
|---|---|---|---|---|---|---|---|---|
| 1 (CB314#2) | 44.3 (:1) | 3.7 × 10$^{-5}$ | 18.6 (:1) | 1.55 × 10$^{-4}$ | 1.6 | 1.3 × 10$^{-6}$ | 1:4 (:1/28) | 1.0 |
| 3 (CB315) | 9.75 (:1/5) | 8.1 × 10$^{-6}$ | 6.57 (:1/3) | 5.5 × 10$^{-5}$ | 1.6 | 1.3 × 10$^{-6}$ | 1:7 (:1/6) | |
| 5 (CB317) | 3.56 (:1/12) | 3.0 × 10$^{-6}$ | 3.89 (:1/5) | 3.2 × 10$^{-5}$ | 1.6 | 1.3 × 10$^{-6}$ | 1:11 (:1/2) | |
| 10 (CB319#2) | 1.78 (:1/25) | 1.5 × 10$^{-6}$ | 1.89 (:1/10) | 1.6 × 10$^{-5}$ | 1.6 | 1.3 × 10$^{-6}$ | 1:10 (:1) | 18.9 |

REFERENCES

[1] K. D. Rogers, *Powder Diffract.* (1993) 8, 240
[2] F. J. Morin, *Phys. Rev. Lett.* (1959) 3, 34
[3] H. W. Verleur et al., *Phys. Rev.* (1968) 172, 788
[4] A. W. Smith, *Appl. Phys. Lett.* (1973) 23, 437
[5] W. R. Roach, *Appl. Phys. Lett.* (1971) 19, 453
[6] M. A. Richardson et al., *Optics and Laser Tech.* (1998) 30, 137
[7] C. G. Granqvist, *Thin Solid Films* (1990), 193 (194), 730
[8] C. G. Granqvist, *Adv. Mater.* (2003), 15, 1789
[9] C. B. Greenburg, *Thin Solid Films* (1983), 110, 73-82
[10] F. Béteille et al., *J. Sol-Gel Sci. Technol.* (1998), 13, 915
[11] W. Burkhardt et al., *Thin Solid Films* (1999), 345, 229
[12] M. A. Sobhan, *Solar Energy Mater. Solar Cells* (1996), 44, 451
[13] WO2005/059201
[14] C. G. Granqvist, *Thin Solid Films* (1990), 193(194), 730
[15] C. G. Granqvist, *Adv. Mater.* (2003), 15, 1789
[16] T. D. Manning et al., *J. Mater. Chem.* (2002), 12, 2936
[17] C. G. Granqvist, *Thin Solid Films* (1990), 193(194), 730
[18] C. G. Granqvist, *Adv. Mater.* (2003), 15, 1789
[19] U. Quershi et al., *J. Mater. Chem.* (2004), 14, 1190
[20] T. D. Manning et al., *J. Mater Chem.* (2004), 14, 2554
[21] T. D. Manning et al., *Chem. Mater.* (2004), 16, 744
[22] D. K. Rogers, *Powder Diffr.* (1993), 8, 240

The invention claimed is:

1. A method of producing thermochromic vanadium (IV) oxide by atmospheric pressure chemical vapour deposition (APCVD) comprising the steps of:
   (i) mixing together (a) a vanadium precursor, (b) an oxygen precursor, and, optionally, (c) a transition metal dopant precursor in the presence of an inert gas to form a precursor mixture;
   (ii) reacting together the precursors of the precursor mixture in an atmospheric pressure chemical vapour deposition reactor; and
   (iii) depositing the thermochromic vanadium (IV) oxide, characterised in that the vanadium concentration in the precursor mixture is, before reaction, less than 1×10$^{-3}$ mol/dm$^3$; and
   wherein the oxygen concentration in the precursor mixture is, before reaction, less than 1×10$^{-2}$ mol/dm$^3$.

2. The method of claim 1 wherein step (i) comprises mixing together (c) a transition metal dopant precursor.

3. The method of claim 1 wherein the transition metal concentration in the precursor mixture is, before reaction, less than 5×10$^{-3}$ mol/dm$^3$.

4. The method of claim 1 wherein the molar ratio of vanadium to oxygen in the precursor mixture is at most 1:1.

5. The method of claim 1 wherein the molar ratio of vanadium to transition metal in the precursor mixture is at most 1:1.

6. The method of claim 1 wherein the transition metal is tungsten.

7. The method of claim 1 wherein the transition metal dopant precursor is [WCl$_6$].

8. The method of claim 1 wherein the vanadium precursor is [VCl$_4$].

9. The method of claim 1 wherein the oxygen precursor is H$_2$O.

10. A method of producing a film of thermochromic vanadium (IV) oxide on a substrate by atmospheric pressure chemical vapour deposition (APCVD) comprising the steps of:
    (i) mixing together (a) a vanadium precursor, (b) an oxygen precursor, and, optionally, (c) a transition metal dopant precursor in the presence of an inert gas to form a precursor mixture;
    (ii) reacting together the precursors of the precursor mixture in an atmospheric pressure chemical vapour deposition reactor; and
    (iii) depositing the thermochromic vanadium (IV) oxide onto the substrate,
    characterised in that the vanadium concentration in the precursor mixture is, before reaction, less than 1×10$^{-3}$ mol/dm$^3$; and
    wherein the oxygen concentration in the precursor mixture is, before reaction, less than 1×10$^{-2}$ mol/dm$^3$.

11. The method of claim 10 wherein the substrate is a glass substrate.

12. A method of producing thermochromic vanadium (IV) oxide by atmospheric pressure chemical vapour deposition (APCVD) comprising the steps of:
    (i) mixing together (a) a vanadium precursor, (b) an oxygen precursor, and (c) a transition metal dopant precursor in the presence of an inert gas to form a precursor mixture;
    (ii) reacting together the precursors of the precursor mixture in an atmospheric pressure chemical vapour deposition reactor; and
    (iii) depositing the thermochromic vanadium (IV) oxide, characterised in that the vanadium concentration in the precursor mixture is, before reaction, less than 1×10$^{-3}$ mol/dm$^3$.

13. The method of claim 12 wherein step (iii) comprises depositing a film of the thermochromic vanadium (IV) oxide onto a substrate.

14. The method of claim 13 wherein the substrate is a glass substrate.

15. The method of claim 12 wherein the transition metal concentration in the precursor mixture is, before reaction, less than 5×10$^{-3}$ mol/dm$^3$.

16. The method of claim 12 wherein the molar ratio of vanadium to oxygen in the precursor mixture is at most 1:1.

17. The method of claim 12 wherein the molar ratio of vanadium to transition metal in the precursor mixture is at most 1:1.

18. The method of claim 12 wherein the transition metal is tungsten.

19. The method of claim 12 wherein the transition metal dopant precursor is $[WCl_6]$.

20. The method of claim 12 wherein the vanadium precursor is $[VCl_4]$.

21. The method of claim 12 wherein the oxygen precursor is $H_2O$.

* * * * *